United States Patent
Hongo et al.

(10) Patent No.: US 8,274,328 B2
(45) Date of Patent: Sep. 25, 2012

(54) AMPLIFYING APPARATUS

(75) Inventors: Hironobu Hongo, Kawasaki (JP);
Katsutoshi Ishidoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/948,800

(22) Filed: Nov. 18, 2010

(65) Prior Publication Data

US 2011/0115557 A1 May 19, 2011

(30) Foreign Application Priority Data

Nov. 18, 2009 (JP) ................................ 2009-262970

(51) Int. Cl.
*H03G 3/20* (2006.01)
(52) U.S. Cl. .................... 330/127; 330/136; 330/297
(58) Field of Classification Search .................. 330/297, 330/136, 127, 279, 10
See application file for complete search history.

(56) References Cited

U.S. PATENT DOCUMENTS

| | | | |
|---|---|---|---|
| 6,437,641 B1 | 8/2002 | Bar-David | |
| 6,621,350 B2 * | 9/2003 | Verbist et al. | 330/297 |
| 6,975,166 B2 * | 12/2005 | Grillo et al. | 330/136 |
| 7,091,777 B2 * | 8/2006 | Lynch | 330/136 |
| 2003/0146791 A1 | 8/2003 | Shvarts et al. | |

FOREIGN PATENT DOCUMENTS

| | | |
|---|---|---|
| EP | 1638204 A1 | 3/2006 |
| JP | 2000-077953 A | 3/2000 |
| JP | 2005-252817 A | 9/2005 |
| JP | 2008-301135 A | 12/2008 |
| WO | WO-2007/064024 A1 | 6/2007 |
| WO | WO-2007/149346 A2 | 12/2007 |
| WO | WO-2007/149346 A3 | 12/2007 |

OTHER PUBLICATIONS

Partial European Search Report mailed Jun. 1, 2011 for corresponding European Application No. 10190894.5.
European Office Action dated Apr. 25, 2012 for corresponding European Application No. 10190894.5.
HBM, "Current Zero Testing," http://www.hbm.com/en/memu/industries/energy-industry/power-grid-components/current-zero-testing/, printed May 16, 2012, 1 page.

* cited by examiner

*Primary Examiner* — Hieu Nguyen
(74) *Attorney, Agent, or Firm* — Fujitsu Patent Center

(57) ABSTRACT

An amplifying apparatus includes an amplifier that amplifies a signal, using a voltage supplied; a power source unit that generates a first voltage and a second voltage having an amplitude greater than that of the first voltage; and a switching controller that, when the an envelope signal of the signal becomes current zero, switches between and supplies to the amplifier, the first voltage and the second voltage generated by the power source unit.

11 Claims, 27 Drawing Sheets

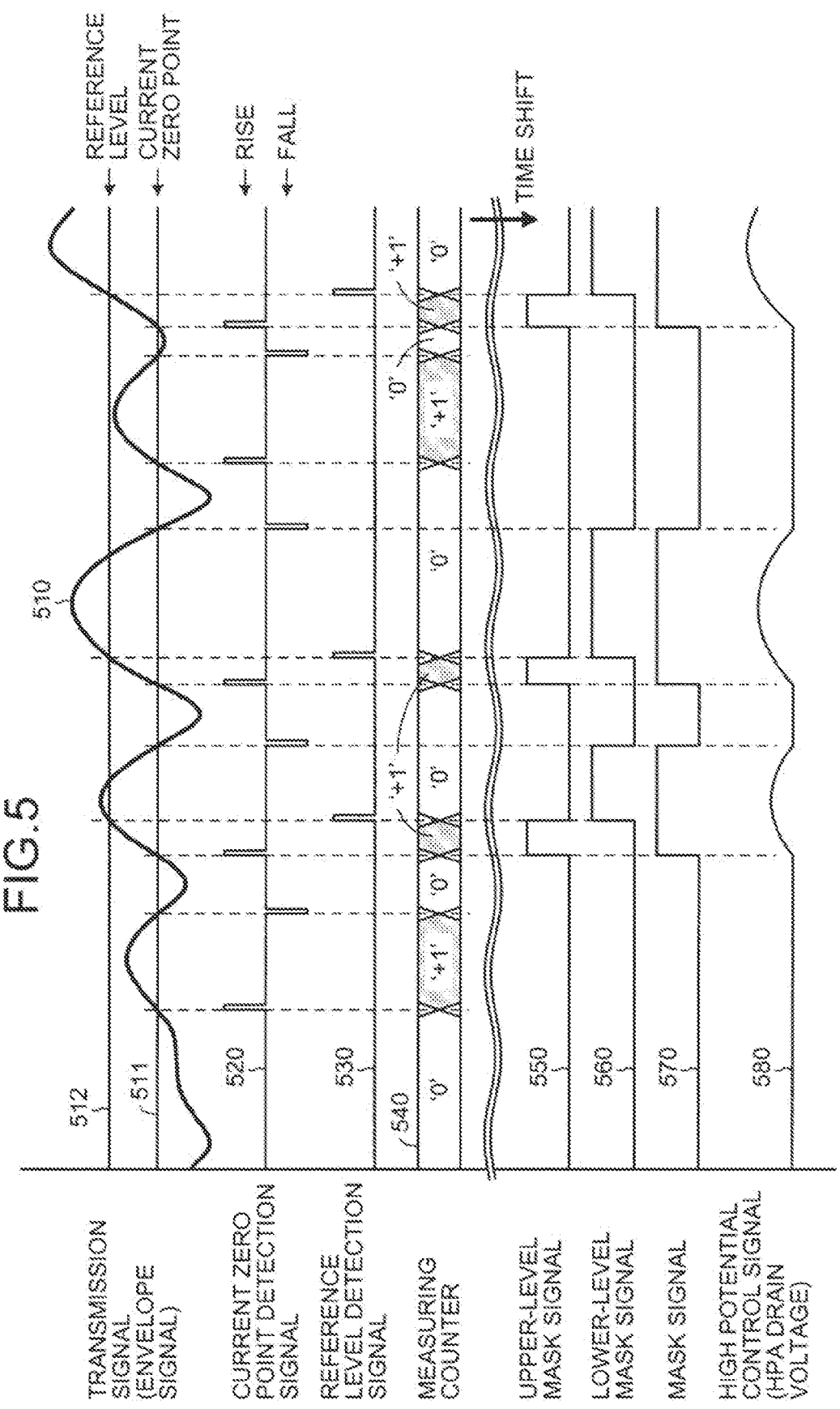

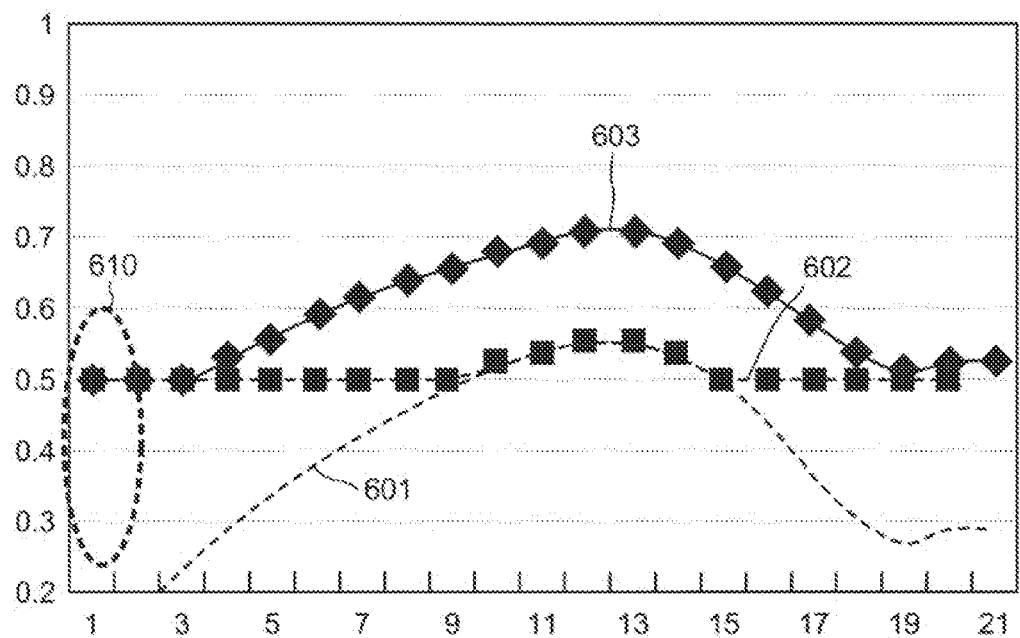
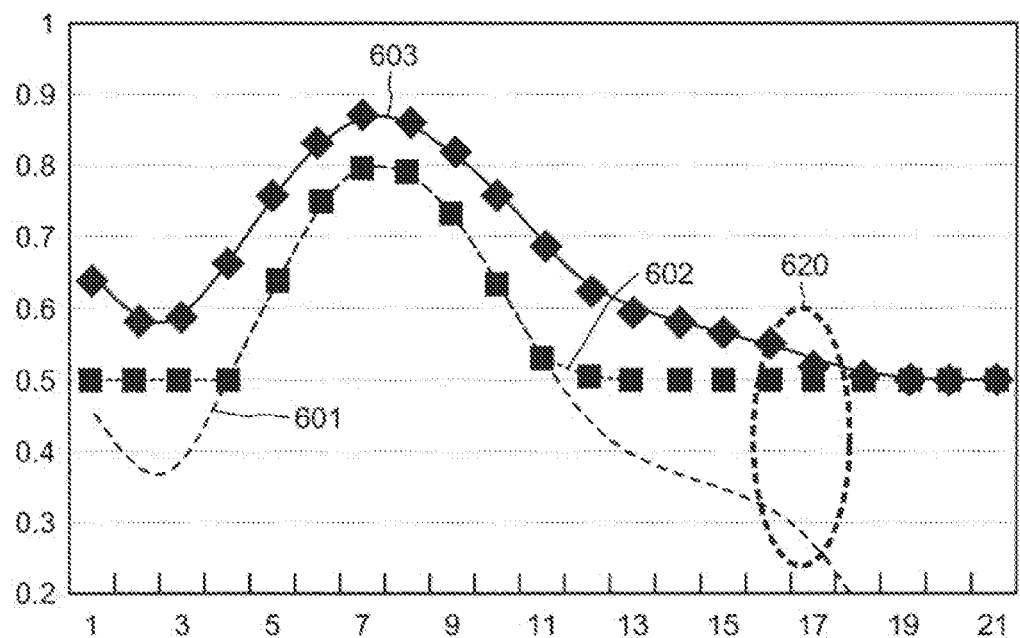

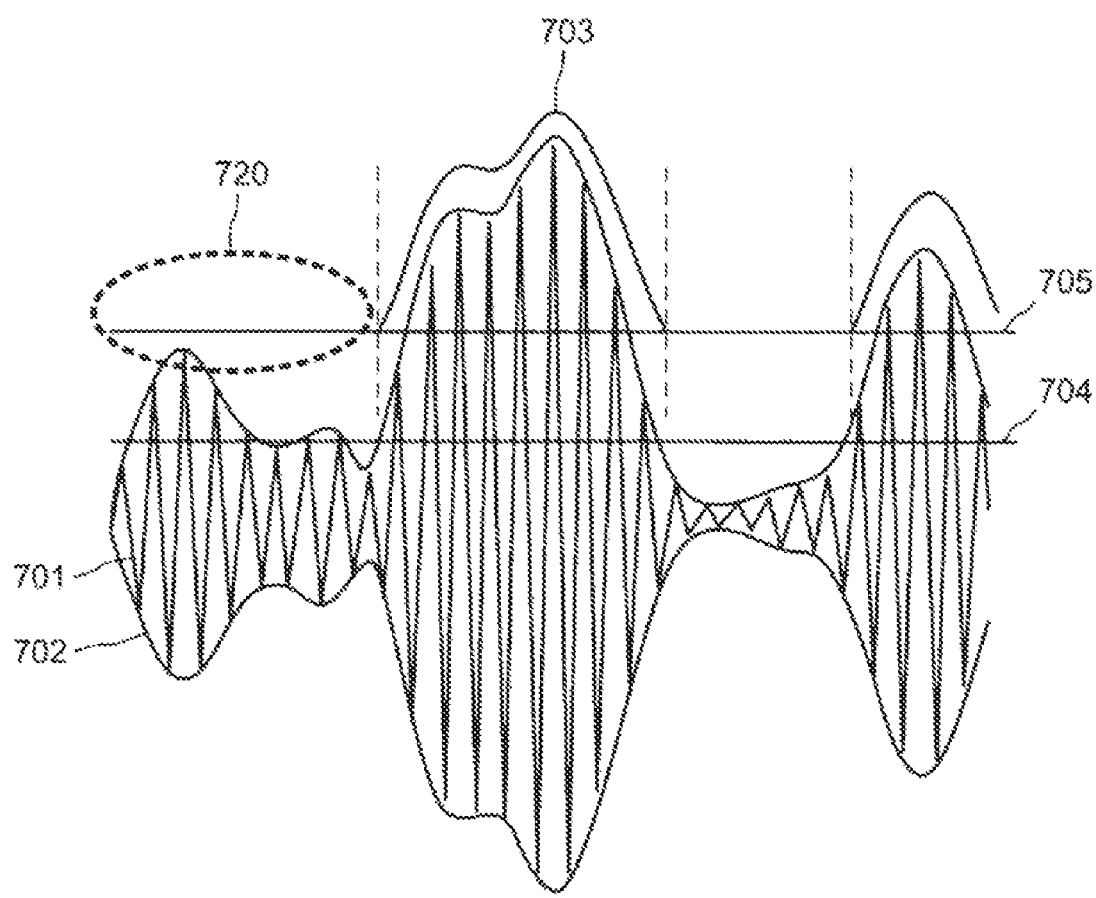

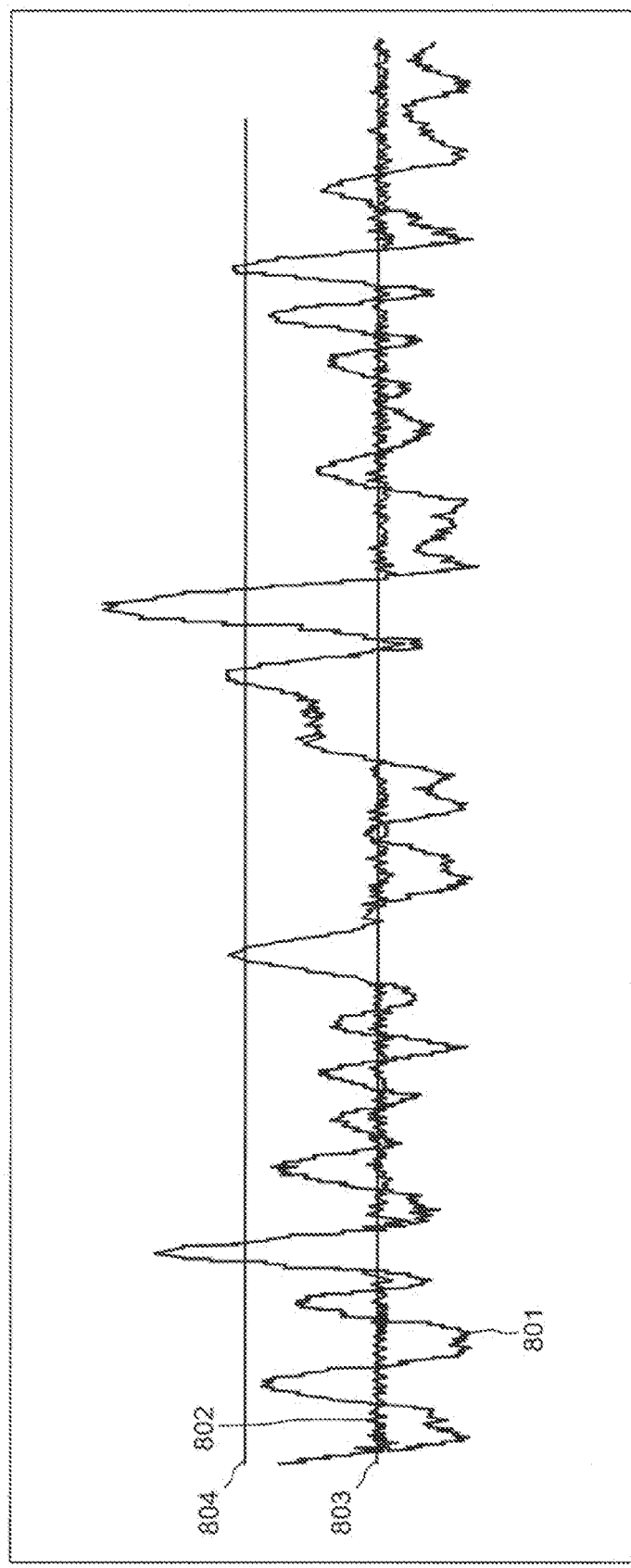

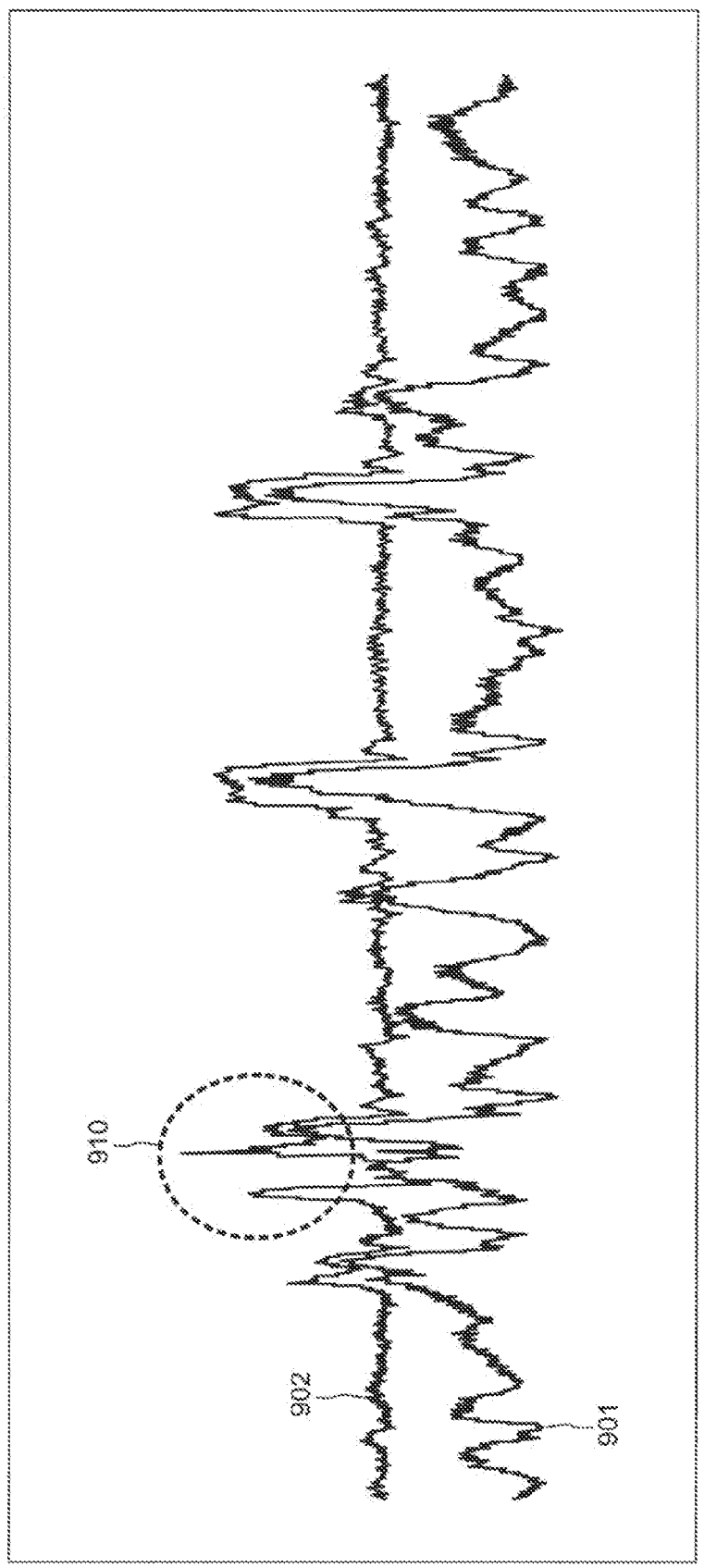

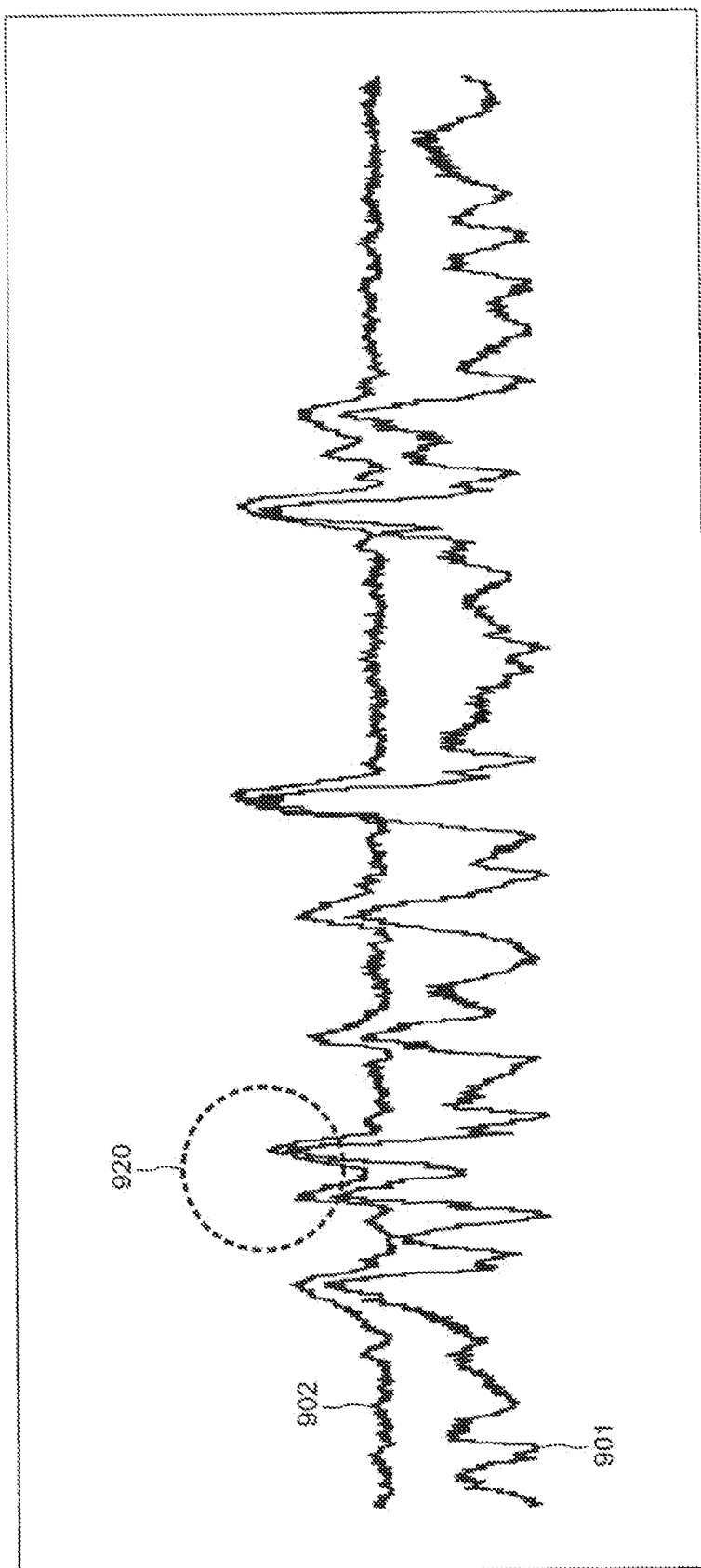

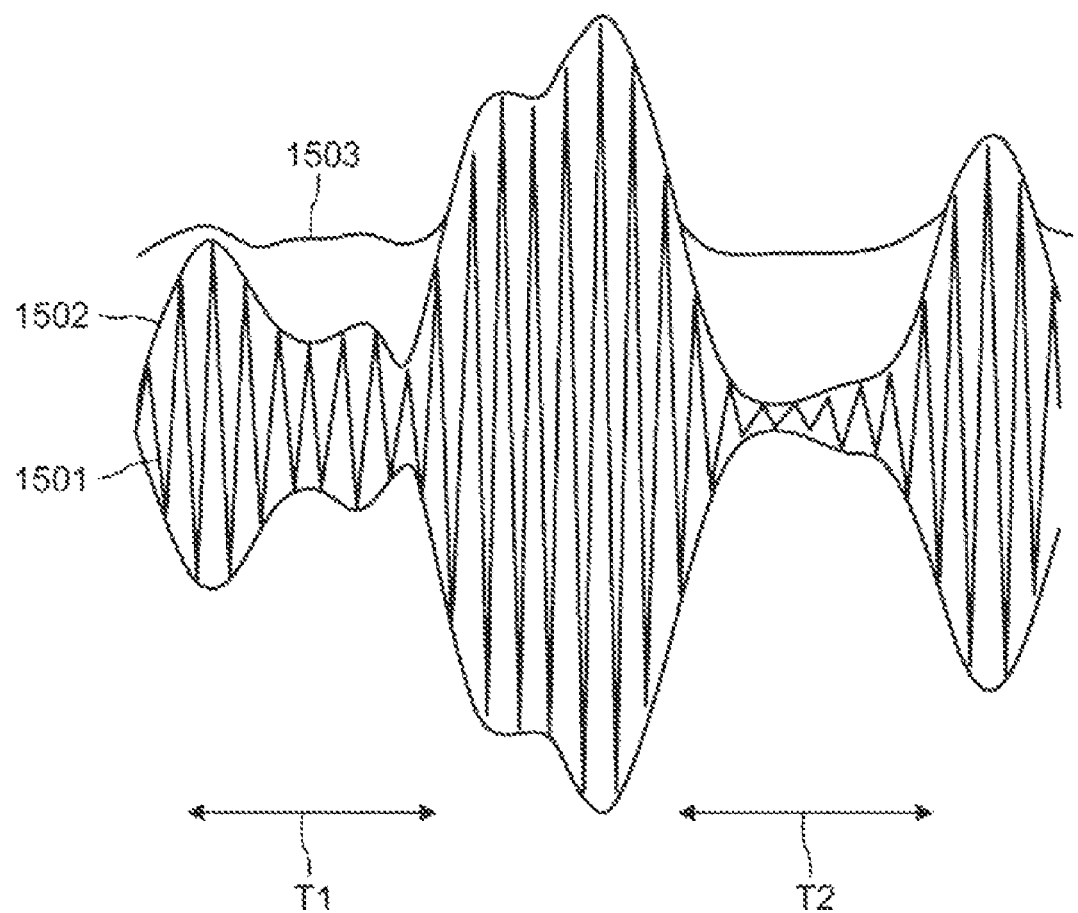

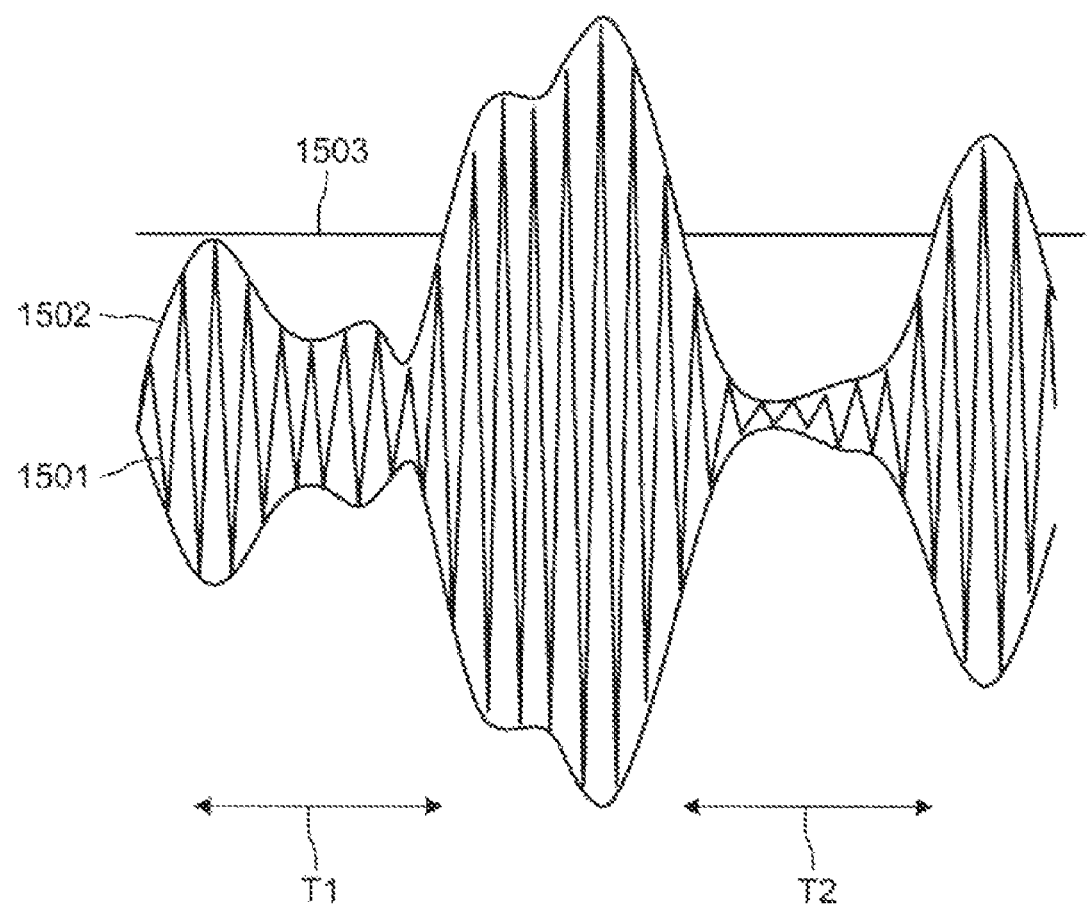

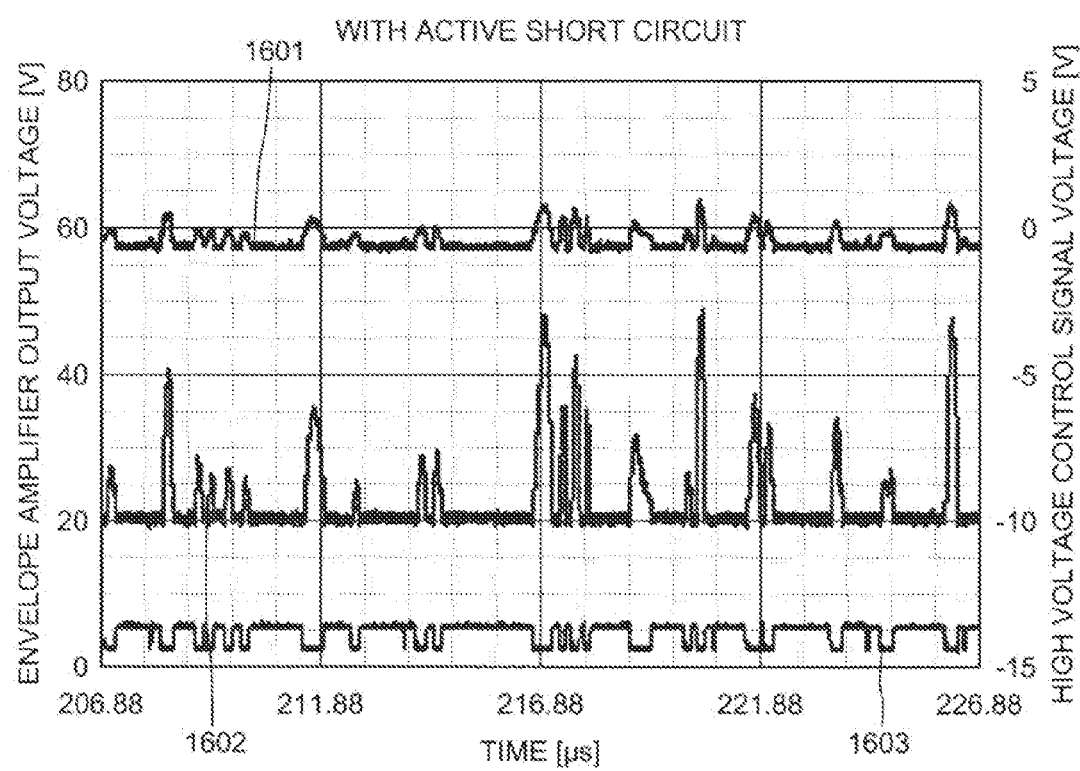

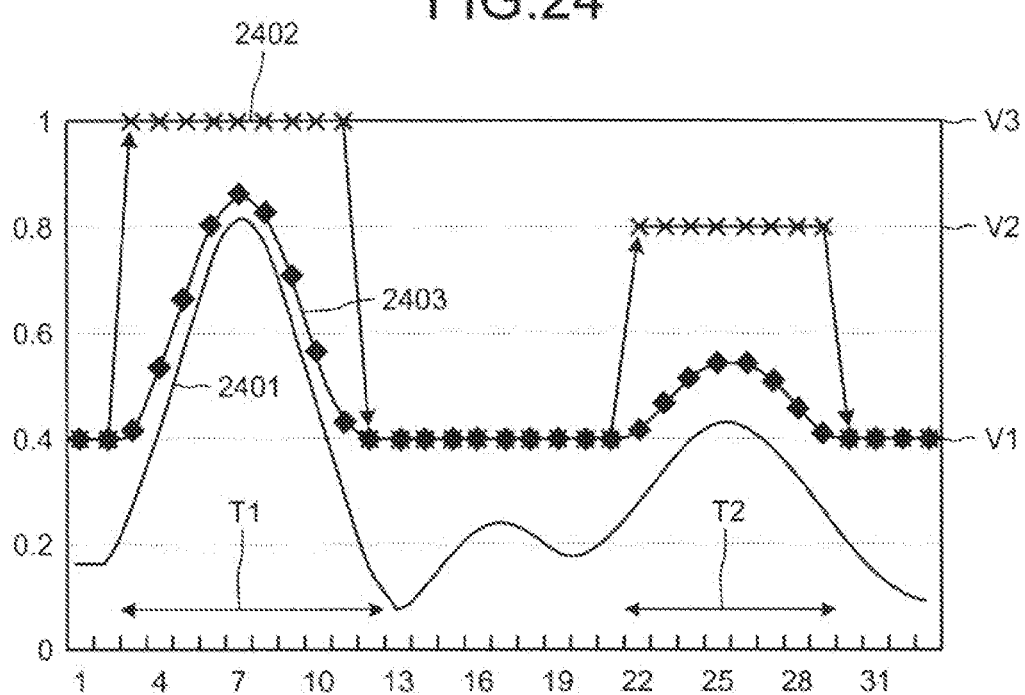

AMPLIFYING APPARATUS

CROSS-REFERENCE TO RELATED APPLICATIONS

This application is based upon and claims the benefit of priority from the prior Japanese Patent Application No. 2009-262970, filed on Nov. 18, 2009, the entire contents of which are incorporated herein by reference.

FIELD

The embodiments discussed herein are related to signal amplification.

BACKGROUND

Amplifying apparatuses that amplify signals in a wireless communication device, etc., employ envelope tracking aimed at improving amplification efficiency by applying a voltage similar to the envelope of a transmission signal as the voltage of a power amplifier. A method of improving the amplification efficiency involves switching a power source according to the amplitude of the envelope of the transmission signal (see, e.g., Japanese Laid-Open Patent Publication Nos. 2008-301135, 2005-252817, and 2000-077953). Higher power efficiency while achieving transmission signal quality equivalent to that in the case of generating a fixed voltage in the power amplifier is demanded of wireless communication devices.

In the conventional technologies described above, however, since the power source is switched with a load current flowing through the amplifier, distortion is caused to a waveform of the voltage supplied to the amplifier. Distortion of the waveform causes a problem in that the amplifier is unable to accurately amplify the signal, resulting in deteriorated signal quality. In particular, in a high power amplifier (HPA), due to the flow of a load current of several amperes, the distortion caused to the waveform of the voltage supplied to the HPA results in greatly deteriorated signal quality.

SUMMARY

According to an aspect of an embodiment, an amplifying apparatus includes an amplifier that amplifies a signal, using a voltage supplied; a power source unit that generates a first voltage and a second voltage having an amplitude greater than that of the first voltage; and a switching controller that, when the an envelope signal of the signal becomes current zero, switches between and supplies to the amplifier, the first voltage and the second voltage generated by the power source unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 depicts generation of a high voltage control signal by the digital processor.

FIG. 6A depicts a first example of generation of a high potential control signal.

FIG. 6B depicts a second example of generation of a high potential control signal.

FIG. 7B depicts a second example of the transmission signal and the high voltage control signal.

FIG. 8 depicts a measurement example of the generated high potential control signal.

FIG. 9A depicts a first measurement example of the drain voltage to be supplied to an HPA.

FIG. 9B depicts a second measurement example of the drain voltage to be supplied to the HPA.

FIGS. 15A and 15B depict reduction of the distortion in the high voltage control signal.

FIG. 16B depicts a second example of measurement of the distortion in the high voltage control signal.

FIG. 24 depicts switching of plural high voltages.

DESCRIPTION OF EMBODIMENTS

Preferred embodiments of the present invention will be explained with reference to the accompanying drawings. The disclosed amplifying apparatus alternately supplies a low voltage and a high voltage to an amplifier and by switching between the low voltage and the high voltage at a current zero point of an envelope signal in the amplifying apparatus. The voltage supplied at the time of the switching is nearly zero, thereby preventing distortion of the amplified signal.

Figure 1:
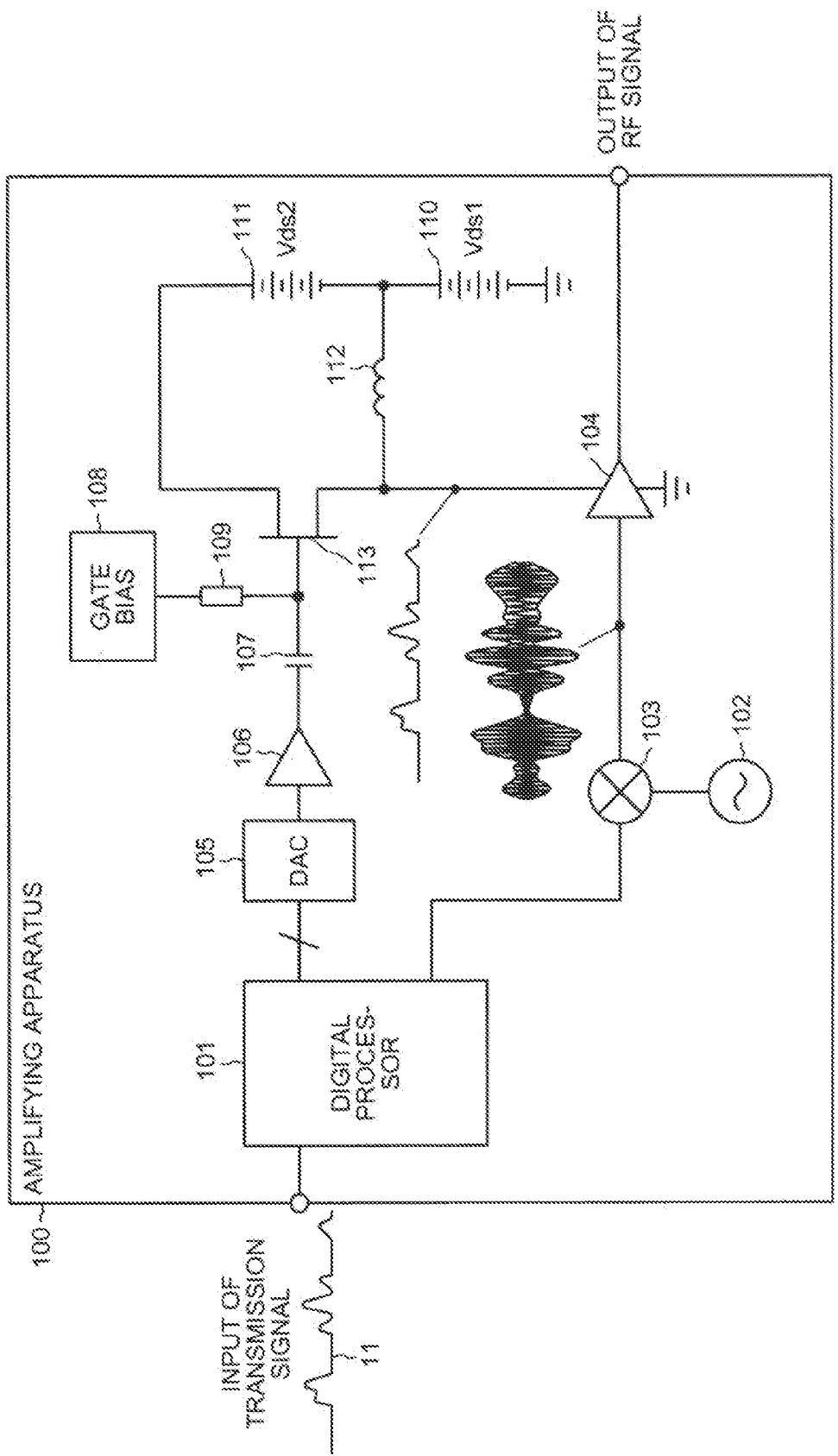
FIG. 1 depicts a configuration of an amplifying apparatus according to a first embodiment.

FIG. 1 depicts a configuration of an amplifying apparatus according to a first embodiment. As depicted in FIG. 1, an amplifying apparatus 100 according to the first embodiment includes a digital processor 101, an oscillator 102, a multiplier 103, an HPA 104, a digital/analog converter (DAC) 105, a preamplifier 106, a capacitor 107, a gate bias 108, a bias resistor 109, a first power source 110, a second power source 111, a coil 112, and a switch 113.

The amplifying apparatus 100 is, for example, an amplifying apparatus that amplifies transmission signals in a communication device. Here, description is made of an example in which a transmission signal 11 is amplified by the amplifying apparatus 100. The signal to be amplified by the amplifying apparatus 100, however, is not limited to the transmission signal 11.

The transmission signal 11 to be amplified by the amplifying apparatus 100 is input to the digital processor 101. The signal processor 101 digitally processes the input transmission signal 11. The digital processor 101, for example, performs distortion compensation processing with respect to the transmission signal 11 and outputs the digitally processed transmission signal 11 to the multiplier 103. Further, the digital processor 101 generates a high voltage control signal, based on the input transmission signal 11 and outputs the generated high voltage control signal to DAC 105.

The oscillator 102 generates a clock signal and outputs the clock signal to the multiplier 103. The multiplier 103 multiplies the transmission signal 11 output from the digital processor 101 by the clock signal output from the oscillator 102, thereby modulating the clock signal according to the transmission signal 11 and generating an RF signal. The multiplier 103 outputs the generated RF signal to the HPA 104. The HPA 104 is an amplifier that, using the voltage to be supplied, amplifies the RF signal output from the multiplier 103 and outputs the amplified voltage downstream. The RF signal output from the HPA 104 is wirelessly transmitted downstream, for example, by an antenna, etc.

The DAC 105 converts the high voltage control signal output from the digital processor 101 to an analog signal and outputs the analog signal to the preamplifier 106. The preamplifier 106 amplifies the high voltage control signal output from the DAC 105 and outputs the amplified high voltage control signal to a gate of the switch 113. The capacitor 107, disposed between the preamplifier 106 and the switch 113, cuts a DC component of the high voltage control signal. The gate bias 108 generates a fixed voltage to the switch 113. The bias resistor 109 is disposed between the bias gate 108 and the switch 113.

The first power source 110 generates a voltage Vds1. The second power source 111 generates a voltage Vds2. The first power source 110 and the second power source 111 are connected in series. The negative side of the first power source 110 is grounded. One end of the coil 112 is connected to the positive side of the first power source 110 and the negative side of the second power source 111. The other end of the coil 112 is connected to the source of the switch 113 and the drain of the HPA 104.

The drain of the switch 113 is connected to the positive side of the second power source 111. The source of the switch 113 is connected to the HPA 104. Thus, a high voltage (Vds1+Vds2) from the first power source 110 and the second power source 111 is supplied to the HPA 104 during the period in which the high voltage control signal output from the DAC 105 to the switch 113 is on. A low voltage (Vds1) from the first power source 110 is supplied to the HPA 104 by way of the coil 112 during the period in which the high voltage control signal output from the DAC 105 to the switch 113 is off. The high voltage (Vds1+Vds2) is a first voltage that is higher than the low voltage (Vds1). The low voltage (Vds1) is a second voltage that is lower than the high voltage (Vds1+Vds2).

In the configuration above, the first power source 110 and the second power source 111 constitute a power source unit that generates the low voltage and the high voltage. The digital processor 101 and the switch 113 constitute a switching controller that, when the envelope signal of the transmission signal to be amplified becomes zero current, switches between the low voltage and the high voltage generated by the first power source 110 and the second power source 111, and supplies the voltage to the HPA 104. Thus, the voltage supplied to the HPA 104 at the time of switching between the low voltage and the high voltage becomes nearly zero.

Figure 2:
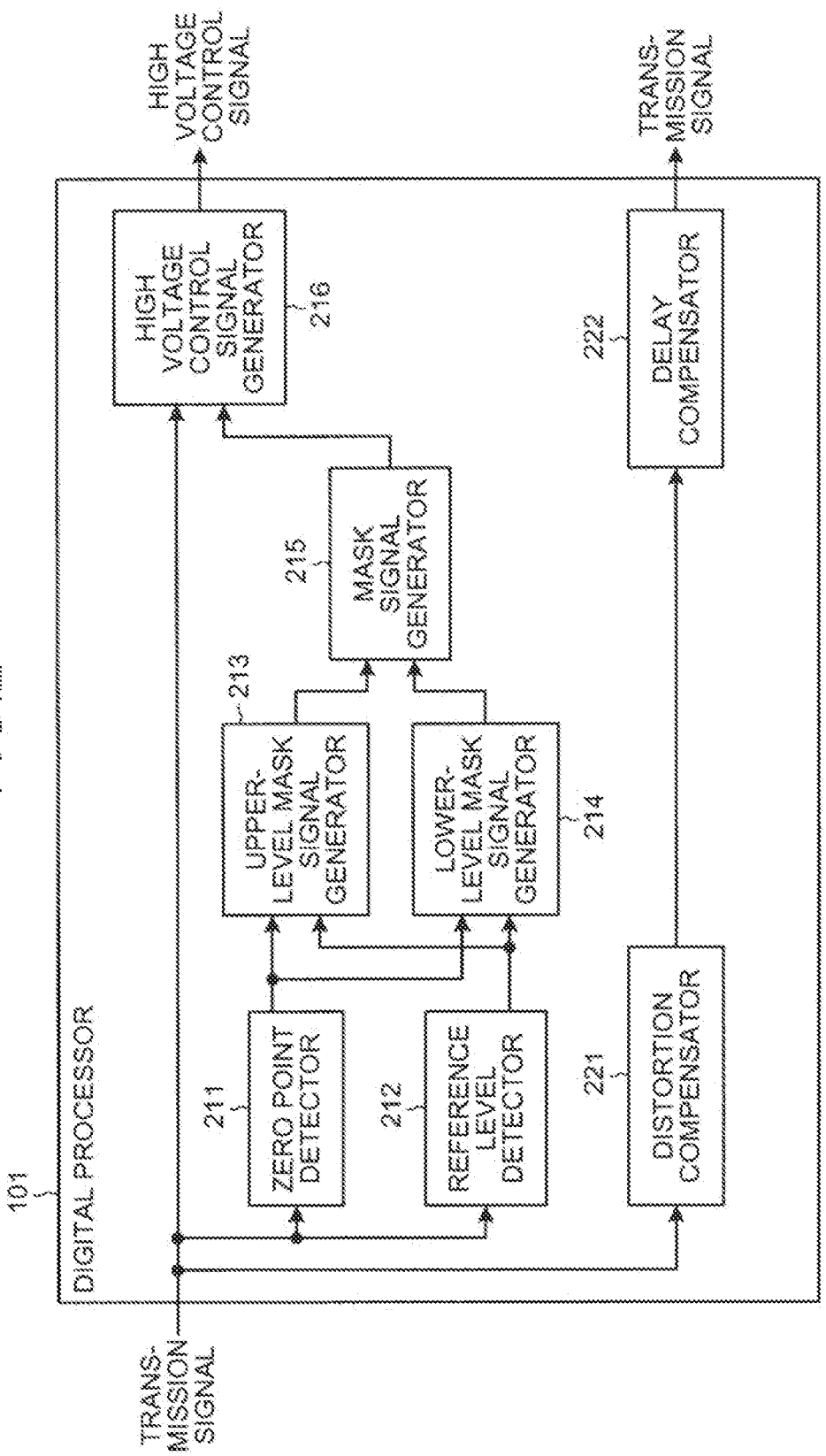
FIG. 2 is a block diagram of a configuration example of the digital processor depicted in FIG. 1.

FIG. 2 is a block diagram of a configuration example of the digital processor depicted in FIG. 1. As depicted in FIG. 2, the digital processor 101 includes a zero point detector 211, a reference level detector 212, an upper-level mask signal generator 213, a lower-level mask signal generator 214, a mask signal generator 215, a high voltage control signal generator 216, a distortion compensator 221, and a delay compensator 222. The transmission signal 11 is input to the zero point detector 211, the reference level detector 212, the high voltage control signal generator 216, and the distortion compensator 221.

The zero point detector 211 detects rises and falls in the envelope signal of the transmission signal 11 relative to a current zero point. For example, a rise from the current zero point occurs when the voltage changes from a state of being lower than zero to a state of being higher than zero. A fall from the current zero point occurs when the voltage changes from a state of being higher than zero to a state of being lower than zero. In the following description, the period from a fall from the current zero point to a rise therefrom is referred to as a first period and the period from a rise from the current zero point to a fall therefrom is referred to as a second period. The zero point detector 211 outputs to the upper-level mask signal generator 213 and the lower-level mask signal generator 214, a current zero point detection signal indicative of results of the detection.

The reference level detector 212 detects a reference level in the envelope signal of the input transmitting signal 11. The reference level detected by the reference level detector 212 is, for example, a level of a potential higher than that of the current zero. The reference level detector 212 outputs to the upper-level mask signal generator 213 and the lower-level mask signal generator 214, a reference level detection signal indicative of the results of the detection.

The upper-level mask signal generator 213 (first generator) generates an upper-level mask signal (first mask signal) for a high voltage interval, based on the current zero point detection signal output from the zero point detector 211 and the reference level detection signal output from the reference level detector 212. For example, the upper-level mask signal generator 213 generates an upper-level mask signal indicative of the period from the detection of a rise from the current zero point until the detection of the reference level. The upper-level mask signal generator 213 outputs the generated upper-level mask signal to the mask signal generator 215.

The lower-level mask signal generator 214 (second generator) generates a lower-level mask signal (second mask signal) for the high voltage interval, based on the current zero point detection signal output from the zero point detector 211 and the reference level detection signal output from the reference level detector 212. For example, the lower-level mask signal generator 214 generates a lower-level mask signal indicative of the period from the detection of the reference level until the detection of a fall from the current zero point.

The lower-level mask signal generator 214 outputs the generated lower-level mask signal to the mask signal generator 215.

The mask signal generator 215 (third generator) generates a mask signal, based on the upper-level mask signal output from the upper-level mask signal generator 213 and the lower-level mask signal output from the lower-level mask signal generator 214. For example, the mask signal generator 215 generates a mask signal indicative of logical OR of the upper-level mask signal and the lower-level mask signal. The mask signal generator 215 outputs the generated mask signal to the high voltage control signal generator 216.

Thus, the upper-level mask signal generator 213, the lower-level mask signal generator 214, and the mask signal generator 215 are capable of generating a mask signal indicative of the second period from the detection of a rise from the current zero point until the detection of a fall therefrom. Configuration may be such that the upper-level mask signal generator 213 generates an upper-level mask signal indicative of the period from the detection of a rise from the current zero point until the detection of the reference level, during which a fall from the current zero point is not detected. In this case, the upper-level mask signal generator 213, the lower-level mask signal generator 214, and the mask signal generator 215 are capable of generating a mask signal indicative of the second period in which the reference level has been detected.

The high voltage control signal generator 216 generates a high voltage control signal, based on the envelope signal of the transmission signal 11 and the mask signal output from the mask signal generator 215. For example, the high voltage control signal generator 216 generates a high voltage control signal of a voltage waveform that is similar to that of the envelope signal during the period indicated by the mask signal and is off during the period not indicated by the mask signal. For example, the high voltage control signal generator 216 generates a high voltage control signal indicative of logical AND of the envelope signal and the mask signal.

The high voltage control signal generator 216 outputs the generated high voltage control signal to the DAC 105. Consequently, switching between the low voltage and the high voltage supplied to the HPA 104, at the current zero point of the envelope signal of the transmission signal 11 is enabled. Furthermore, the high voltage supplied to the HPA 104 can be induced to have a voltage waveform similar to that of the envelope signal of the transmission signal 11. Therefore, envelope tracking can be realized.

The distortion compensator 221 compensates the input transmission signal 11 for distortion and outputs the compensated transmission signal 11 to the delay compensator 222. The delay compensator 222 adjusts the delay of the transmission signal 11 from the distortion compensator 221 and outputs the transmission signal 11. For example, the delay compensator 222 adjusts the delay of the transmission signal 11 so that the timing of the high voltage control signal output from the high voltage control signal generator 216 and the timing of the transmission signal output from the delay compensator 222 coincide.

In the configuration above, the high voltage control signal generator 216 and the switch 113 constitute a switching unit that supplies the low voltage during the first period and the high voltage during the second period. For example, the high voltage control signal generator 216 and the switch 113 supply the HPA 104 with the high voltage during the period indicated by the generated mask signal and the low voltage during the period not indicated by the mask signal.

Figure 3:
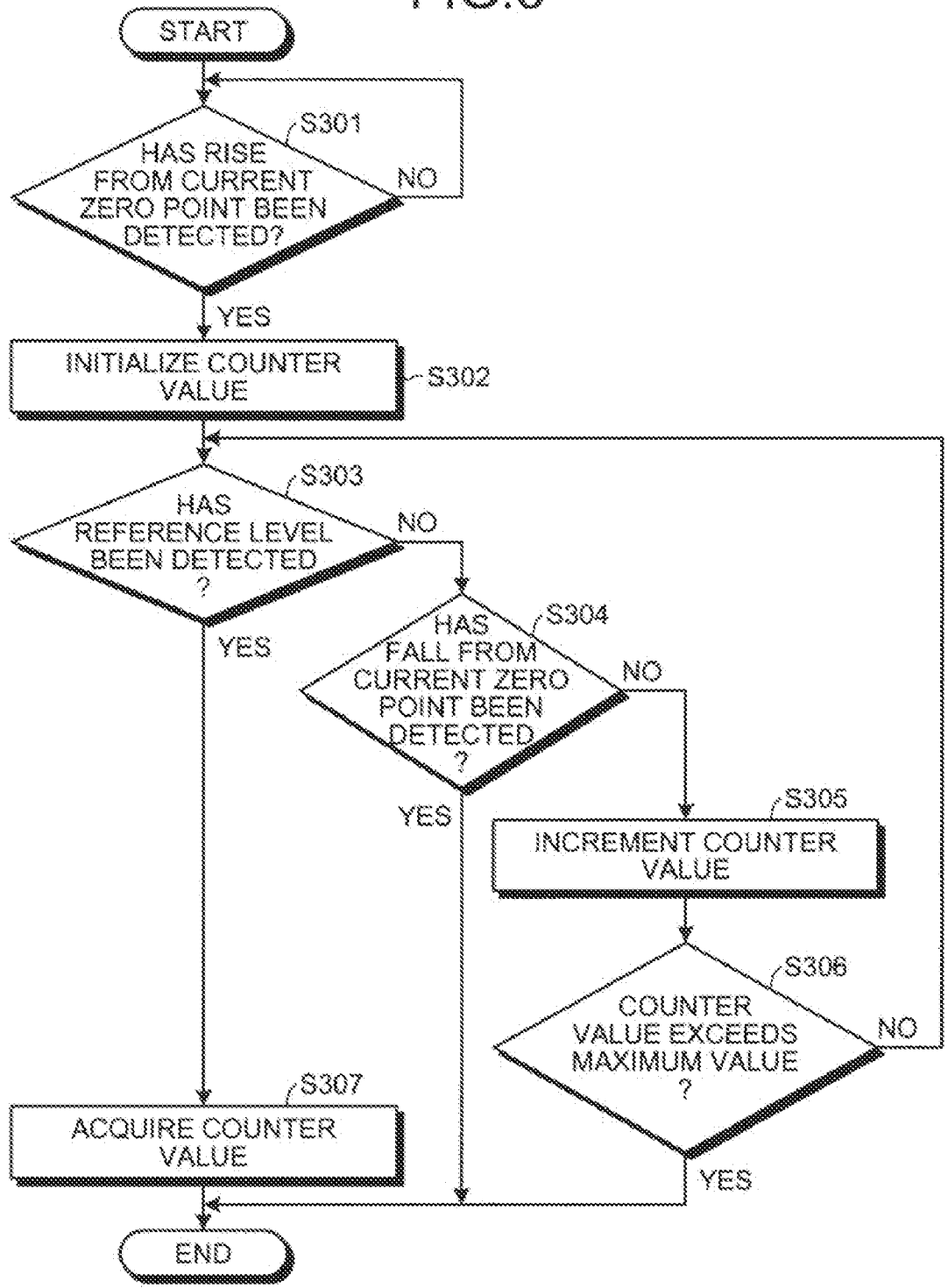
FIG. 3 is a flowchart of one example of operations for generating an upper-level mask signal.

FIG. 3 is a flowchart of one example of operations for generating the upper-level mask signal. The upper-level mask signal generator 213 has a measuring counter that measures, for example, the period from the detection of the rise from the current zero point until the detection of the reference level. The upper-level mask signal generator 213 generates the upper-level mask signal according to the steps depicted in FIG. 3. Firstly, judgment is made of whether a rise from the current zero point has been detected by the zero point detector 211 (step S301), waiting occurs until a rise is detected (step S301: NO).

At step S301, when a rise from the current zero point is detected (step S301: YES), the counter value of the measuring counter is initialized (step S302). Subsequently, judgment is made of whether the reference level has been detected by the reference level detector 212 (step S303). If the reference level has not been detected (step S303: NO), judgment is made of whether a fall from the current zero point has been detected (step S304).

At step S304, if a fall from the current zero point has been detected (step S304: YES), a sequence of the operations ends. If a fall from the current zero point has not been detected (step S304: NO), the counter value is incremented (step S305). Subsequently, judgment is made of whether the counter value at step S305 exceeds a maximum value (step S306).

At step S306, if the counter value exceeds the maximum value (step S306: YES), then a sequence of the operations ends. If the counter value has not exceeded the maximum value (step S306: NO), the flow returns to step S303. At step S303, if the reference level has been detected (step S303: YES), the counter value is acquired (step S307) and a sequence of the operations ends.

Repetition of the above steps enables the upper-level mask signal generator 213 to acquire, at step S307, the period from the detection of the rise from the current zero point until the detection of the reference level, and during which there is no detection of a fall from the current zero point. The upper-level mask signal generator 213 generates the upper-level mask signal indicative of the period acquired at step S307.

Figure 4:
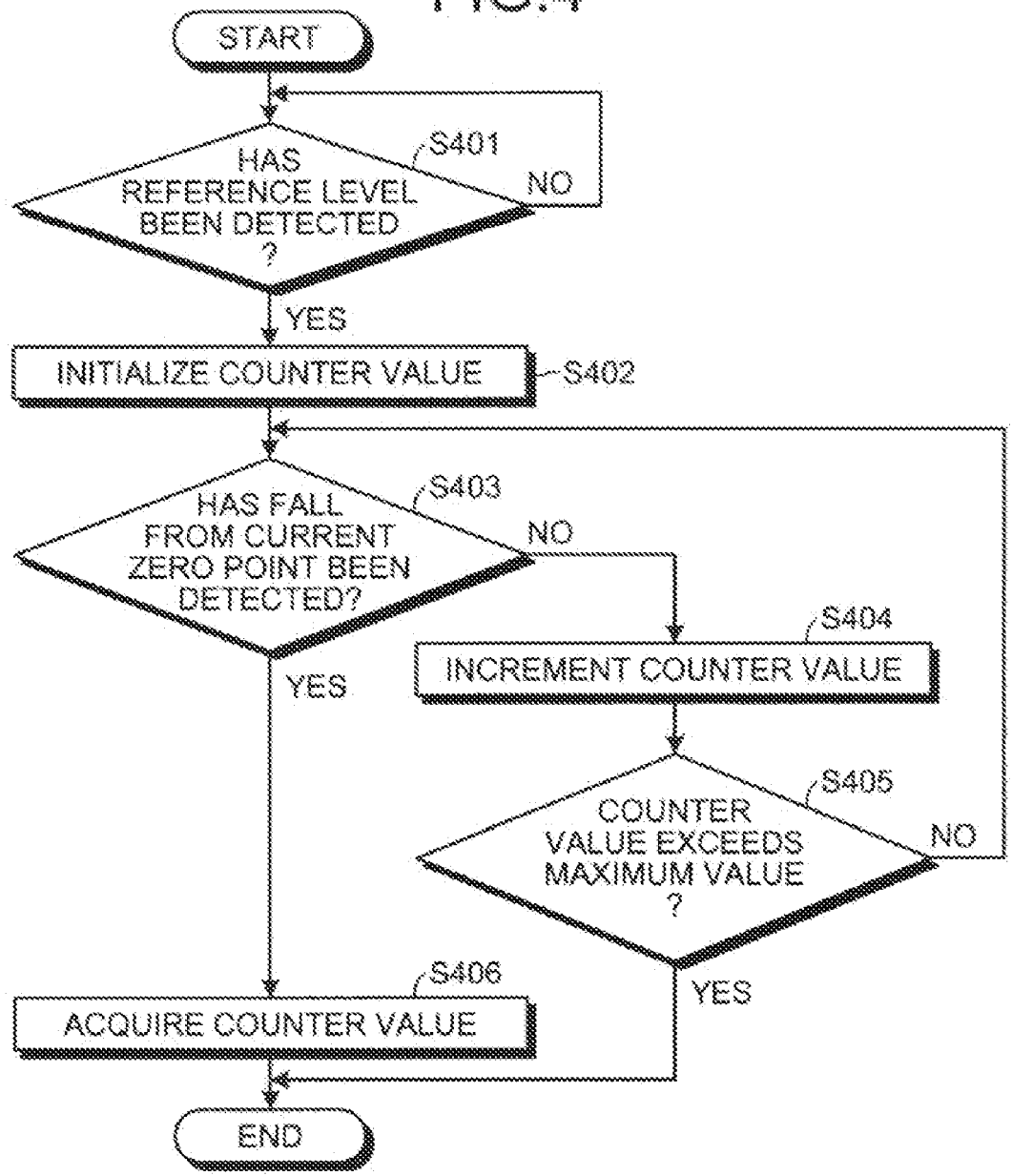
FIG. 4 is a flowchart of one example of operations for generating a lower-level mask signal.

FIG. 4 is a flowchart of one example of operations for generating the lower-level mask signal. The lower-level mask signal generator 214 has a measuring counter that measures, for example, the period from the detection of the reference level until the detection of a fall from the current zero point and generates the lower-level mask signal by the steps depicted in FIG. 4. Firstly, judgment is made of whether the reference level has been detected by the reference level detector 212 (step S401), waiting occurs until the reference level is detected (step S401: NO). When the reference level is detected (step S401: YES), the counter value of the measuring counter is initialized (step S402).

Judgment is made of whether a fall from the current zero point has been detected by the zero point detector 211 (step S403). If a fall from the current zero point has not been detected (step S403: NO), the counter value is incremented (step S404). Subsequently, judgment is made of whether the counter value incremented at step S404 exceeds a maximum value (step S405).

At step S405, if the counter value exceeds the maximum value (step S405: YES), a sequence of the operations ends. If the counter value does not exceed the maximum value (step S405: NO), the flow returns to step S403. At step S403, if a fall from the current zero point has been detected (step S403: YES), the counter value is acquired (step S406) and a sequence of the operations ends.

Repetition of the above steps enables the lower-level mask signal generator 214 to acquire, at step S406, the period from the detection of the reference level until the detection of a fall from the current zero point. The lower-level mask signal generator 214 generates a lower-level mask signal indicative of the period acquired at step S406.

FIG. 5 depicts generation of the high voltage control signal by the digital processor. An envelope signal 510 in FIG. 5 represents the envelope signal of the transmission signal 11. A current zero point 511 represents the current zero point of the envelope signal 510. A reference level 512 represents the reference level of a potential higher than that of the current zero point 511.

A current zero point detection signal 520 is a signal output by the zero point detector 211 and indicates, for the envelope signal 510, rises and falls from the current zero point 511. For example, the current zero point detection signal 520 becomes "+1" at a rise of the envelope signal 510 from the current zero point 511 and becomes "−1" at a fall of the envelope signal 510 from the current zero point 511.

A reference level detection signal 530 is a signal output by the reference signal detector 212. The reference level detection signal 530 indicates the timing of detection of the reference level. Specifically, the reference level detection signal 530 becomes "+1" at a rise from the reference level 512 of the envelope signal 510.

Reference numeral 540 represents operation of the measuring counter of the upper-level mask signal generator 213. The value of measuring counter of the upper-level mask signal generator 213 is not incremented during a "0" period (reference numeral 540) and is continuously incremented during a "1" period (reference numeral 540). Specifically, the period (reference numeral 540) is "1" during the period from the current zero point detection signal 520 becoming "+1" until the current zero point detection signal 520 becomes "−1" or until the reference level detection signal 530 becomes "+1".

An upper-level mask signal 550 is a signal output from the upper-level mask signal generator 213. The upper-level mask signal 550 indicates the "1" period measured by the measuring counter and excludes the period during which the reference level 512 is not detected. To judge whether the reference level 512 has been detected after the rise from the current zero point 511, the counter value of the measuring counter is stored to a memory and the generation of the upper-level mask signal 550 by the upper-level mask signal generator 213 is performed after a certain time (time shift).

A lower-level mask signal 560 is a signal output from the lower-level mask signal generator 214. The lower-level mask signal 560 indicates the period from the reference level detection signal 530 becoming "+1" until the current zero point detection signal 520 becomes "−1". A mask signal 570 is a signal output from the mask signal generator 215. The mask signal 570 indicates the logical OR of the upper-level mask signal 550 and the lower-level mask signal 560. Therefore, the mask signal 570 is a signal indicative of the second period during which the reference level 512 is detected.

A high potential control signal 580 is a signal output from the high voltage control signal generator 216. The high potential control signal 580 indicates the logical AND of the envelope signal 510 and the mask signal 570. Thus, the high potential control signal 580 is of a voltage waveform that is similar to that of the envelope signal 510 during the period indicated by the mask signal 570 (on period) and is off during the period not indicated by the mask signal 570 (off period). The voltage waveform of a drain voltage to be supplied to the HPA 104 is the same as that of the high potential control signal 580.

Use of the time shift in the detection of the reference level 512 causes a delay of the high potential control signal 580 (low voltage and high voltage supplied to the HPA 104) relative to the transmission signal 11. To cope with this, delay of the transmission signal 11 is adjusted by the delay compensator 222 to compensate for the delay of the high potential control signal 580.

Figure 6C:
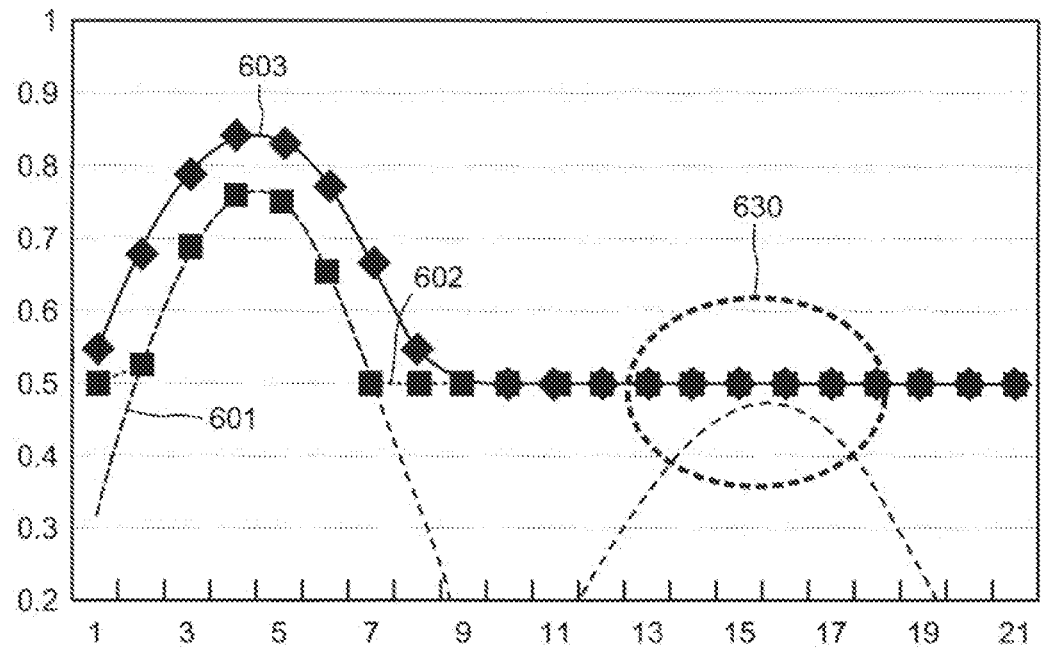
FIG. 6C depicts a third example of generation of a high potential control signal.

FIG. 6A depicts a first example of generation of the high potential control signal. FIG. 6B depicts a second example of generation of the high potential control signal. FIG. 6C depicts a third example of generation of the high potential control signal. In FIGS. 6A to 6C, a horizontal axis represents time and a vertical axis represents voltage. An envelope signal 601 is the envelope signal of the transmission signal 11. A high potential control signal 602 indicates, for reference, the high potential control signal based on the assumption that switching is made between the low voltage and the high voltage at the time of detection of the reference level. A high potential control signal 603 indicates the high potential control signal generated by the digital processor 101. Here, the reference level is set at 0.5.

As depicted by reference numeral 610 of FIG. 6A, the high potential control signal 602 rises when the envelope signal 601 exceeds the reference level of 0.5. In contrast, the high potential control signal 603 generated by the digital processor 101 rises when the envelope signal 601 exceeds the current zero point. Therefore, the rise-timing of the high potential control signal 603 generated by the digital processor 101 is earlier than that of the high potential control signal 602.

As depicted by reference numeral 620 of FIG. 6B, the high potential control signal 602 falls when the envelope signal 601 drops below the reference level of 0.5. In contrast, the high potential control signal 603 generated by the digital processor 101 falls when the envelope signal 601 drops below the current zero point. Therefore, the fall-timing of the high potential control signal 603 generated by the digital processor 101 is later than that of the high potential control signal 602.

As depicted by reference numeral 630 of FIG. 6C, the high potential control signal 603 generated by the digital processor 101 does not rise even when the envelope signal 601 exceeds the current zero point but thereafter, the envelope signal 601 goes below the current zero point without exceeding the reference level of 0.5. Therefore, the high potential control signal 603 does not rise when the envelope signal 601 does not exceed the reference value.

Figure 7A:
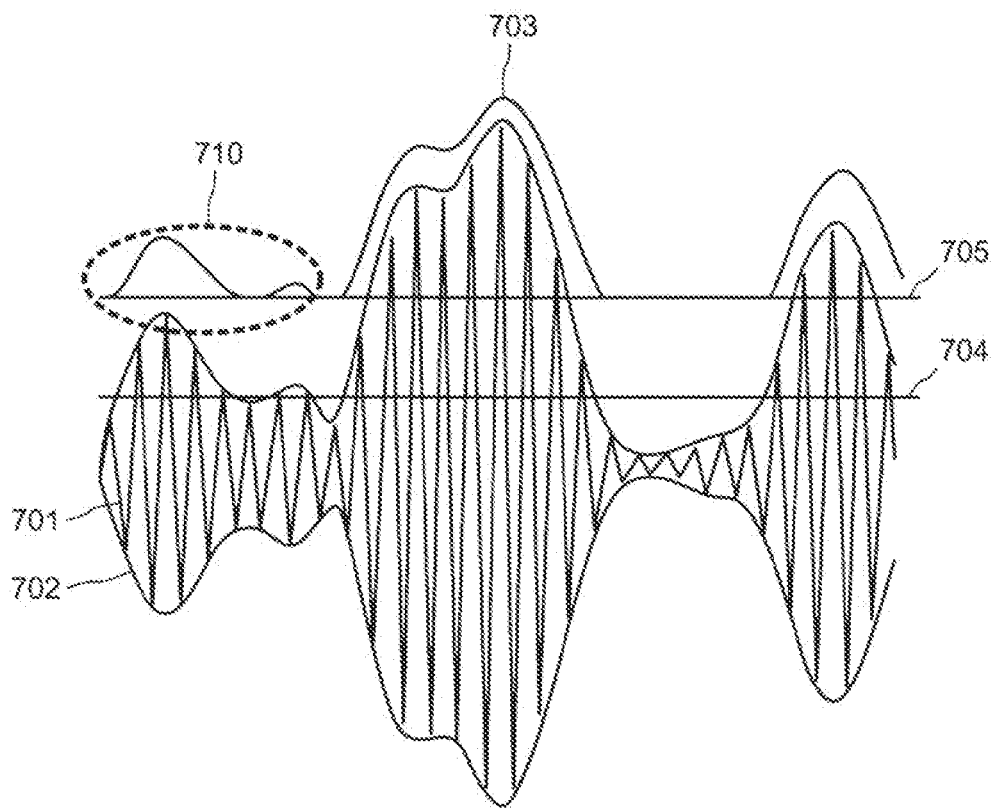
FIG. 7A depicts a first example of a transmission signal and a high voltage control signal.

FIG. 7A depicts a first example of the transmission signal and the high voltage control signal. FIG. 7B depicts a second example of the transmission signal and the high voltage control signal. In FIGS. 7A and 7B, a transmission signal 701 is the transmission signal 11 input to the digital processor 101. An envelope signal 702 is the envelope signal of the transmission signal 701. A high voltage control signal 703 is the high voltage control signal generated by the digital processor 101. A current zero point 704 is the current zero point of the transmission signal 701. A reference level 705 is the reference level, which is of a potential higher than that of a current zero point 704.

The high voltage control signal 703 of FIG. 7A indicates the high voltage control signal that rises from the time that the transmission signal 701 exceeds the current zero point 704 until the time that the transmission signal 701 drops below the current zero point 704. In this case, as depicted by reference numeral 710 of FIG. 7A, the high voltage control signal 703 rises even when the transmission signal 701 does not exceed the reference level 705.

The high voltage control signal 703 of FIG. 7B represents the high voltage control signal 703 depicted in FIG. 7A, masked for the interval from when the transmission signal 701 exceeds the current zero point 704 until the transmission signal 701 drops below the current zero point 704 without exceeding the reference level 705. In this case, as depicted by reference numeral 720, the high voltage control signal 703 does not rise when the transmission signal 701 does not exceed the reference level 705. This prevents a wasteful voltage from being generated.

The digital processor 101 can generate the high voltage control signal 703 depicted in FIG. 7A by generating the mask signal indicative of the second period from the detection of the rise from the current zero point until the detection of the fall therefrom. The digital processor 101 can generate the high voltage control signal 703 depicted in FIG. 7B by generating the mask signal indicative of the second period in which the reference level is detected.

FIG. 8 depicts a measurement example of the high potential control signal generated. In FIG. 8, an envelope signal 801 is the envelope signal of the transmission signal 11. A high voltage control signal 802 is the high voltage control signal generated by the digital processor 101. A current zero point 803 is the current zero point of the envelope signal 801. A reference level 804 is the reference level, which is of a potential higher than that of the current zero point 803.

As depicted in FIG. 8, the high voltage control signal 802 is of a voltage waveform obtained by slicing the envelope signal 801 at the current zero point 803. Among the high voltage intervals in which the envelope signal 801 exceeds the current zero point 803, the high voltage control signal 802 is masked in the high voltage intervals in which a maximum value of the envelope signal 801 does not reach the reference level 804.

FIG. 9A depicts a first measurement example of the drain voltage to be supplied to the HPA. FIG. 9B depicts a second measurement example of the drain voltage to be supplied to the HPA. In FIGS. 9A and 9B, an envelope signal 901 is the envelope signal of the transmission signal 11. A drain voltage 902 is the drain voltage to be supplied to the HPA 104.

FIG. 9A depicts, for reference, the drain voltage 902 based on the assumption that switching between the low voltage and the high voltage is made at the reference level rather than at the current zero point. In this case, reference numeral 910 shows a distortion of the drain voltage 902 at the time of switching between the low voltage and the high voltage.

FIG. 9B depicts the drain voltage 902 in the case of switching between the low voltage and the high voltage at the current zero point of the envelope signal 901. In this case, reference numeral 920 shows no distortion of the drain voltage 902 at the time of switching between the low voltage and the high voltage. This enables the envelope signal 901 to be accurately amplified.

Thus, the amplifying apparatus 100 according to the first embodiment switches between the generated low voltage and high voltage when the envelope signal of the transmission signal 11 becomes current zero and supplies the voltage to the HPA 104. This makes it possible to bring the voltage supplied to the HPA 104 to nearly zero at the time of switching between the low voltage and the high voltage. For this reason, the distortion of the voltage supplied to the HPA 104 can be prevented and the RF signal can be accurately amplified at the HPA 104.

Specifically, the amplifying apparatus 100 detects the rise and the fall from the current zero point in the envelope signal of the transmission signal 11 and supplies the low voltage to the HPA 104 during the first period from the detection of the fall until the detection of the rise. The amplifying apparatus 100 supplies the high voltage to the HPA 104 during the second period from the detection of the rise until the detection of the fall. This makes it possible to switch between the low voltage and the high voltage when the envelope signal of the transmission signal 11 becomes current zero.

The amplifying apparatus 100, however, detects the reference level in the envelope signal and during a second period in which the reference level is detected, supplies the HPA 104 with the high voltage, while supplying the low voltage in a second period in which the reference level is not detected. This makes it possible to supply the low voltage to the HPA 104 during a period in which the envelope signal is detected to have exceeded the current zero point, but falls without exceeding the reference level. This enables power consumption to be reduced during the period in which the reference level is not exceeded.

Specifically, the amplifying apparatus 100 generates an upper-level mask signal indicative of the period from the detection of a rise above the current zero point until the detection of the reference level when there is no detection of a fall below the current zero point and a lower-level mask signal indicative of the period from the detection of the reference level until the detection of a fall below the current zero point. The amplifying apparatus 100 switches between the low voltage and the high voltage based on the mask signal indicative of the logical OR of the upper-level mask signal and the lower-level mask signal thus generated. This makes it possible to supply the HPA 104 with the high voltage during second periods in which the reference level is detected and the low voltage during second periods in which the reference level is not detected.

Figure 10:
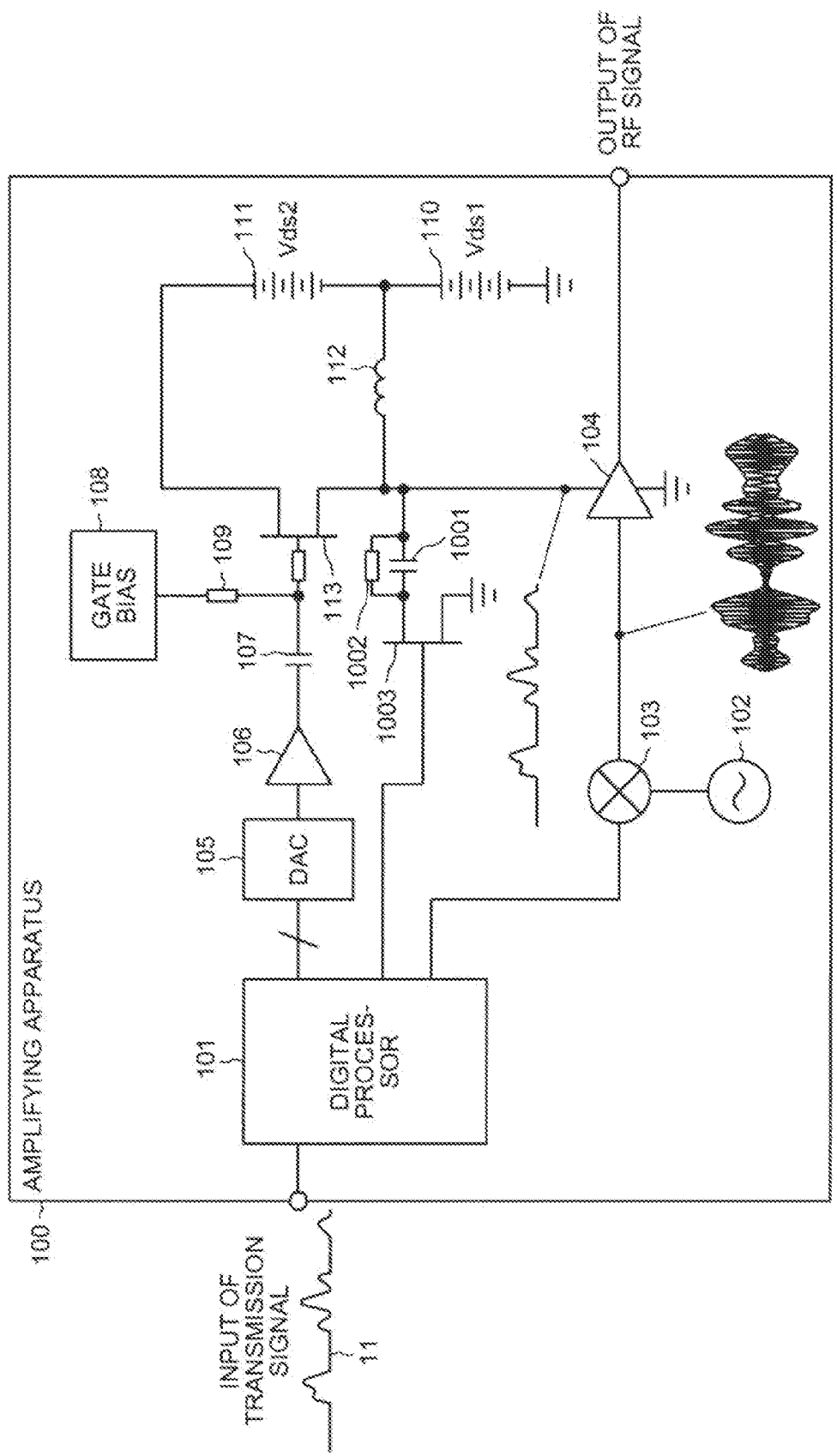
FIG. 10 depicts a configuration of the amplifying apparatus according to a second embodiment.

FIG. 10 depicts a configuration of the amplifying apparatus according to a second embodiment. In FIG. 10, components identical to those depicted in FIG. 1 are given the same reference numerals used in FIG. 1 and description thereof is omitted hereinafter. As depicted in FIG. 10, the amplifying apparatus 100 according to the second embodiment, in addition to the configuration depicted in FIG. 1, further includes a bypass capacitor 1001, a bias resistor 1002, and an FET 1003 as an active short circuit. The digital processing circuit 101 generates an active short control signal, based on the envelope signal of the input transmission signal 11. The digital processor 101 outputs the generated active short control signal to the FET 1003.

One end of the bypass capacitor 1001 is connected between the HPA 104 and a connection point of the coil 112 and the switch 113 (power source unit). The other end of the bypass capacitor 1001 is connected to the drain of the FET 1003. The bypass capacitor 1001 suppresses fluctuations of a dc source voltage supplied to the HPA 104. The bias resistor 1002 is connected in parallel with the bypass capacitor 1001.

The FET 1003 is a switch circuit that switches validity/invalidity of the bypass capacitor 1001. The FET 1003 makes the bypass capacitor 1001 valid (shorted) during the period in which the low voltage is supplied to the HPA 104 and makes the bypass capacitor 1001 invalid (open) during the period in which the high voltage is supplied to the HPA 104. The drain of the FET 1003 is connected to the bypass capacitor 1001 and the source of the FET 1003 is grounded. The active short control signal output from the digital processor 101 is applied to the gate of the FET 1003.

Figure 11:
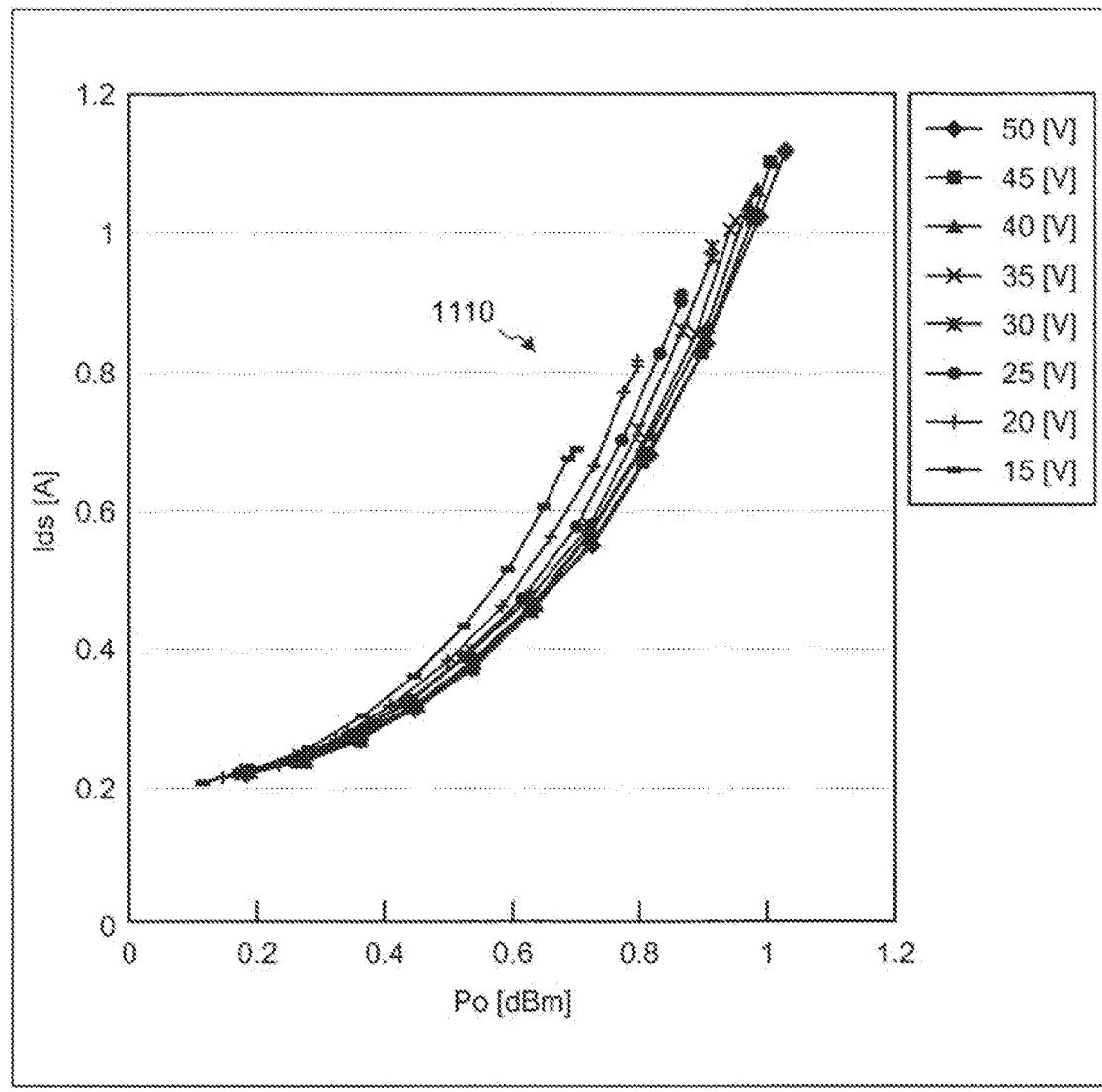
FIG. 11 depicts a graph of Ids to an input level of the HPA.

FIG. 11 depicts a graph of Ids to an input level of the HPA. In FIG. 11, the horizontal axis represents the level of input from the multiplier 103 to the HPA 104 in terms of a normalized output level Po [dBm] of the HPA 104. The vertical axis represents the Ids [A] of HPA 104. The Ids indicates the current flowing from the coil 112 or the switch 113 to the HPA 104. A characterization curve group 1110 indicates characteristics of the change of the Ids to the input level of the HPA 104 at different voltages.

The characterization curve group 1110 demonstrates that the Ids of the HPA 104 fluctuates as the level of the input from the multiplier to the HPA 104 fluctuates. In the constant voltage period in which the low voltage is supplied, when the Ids of the HPA 104 fluctuates, it is difficult to keep the Vds constant unless the output impedance of the envelope is kept low.

Figure 12:
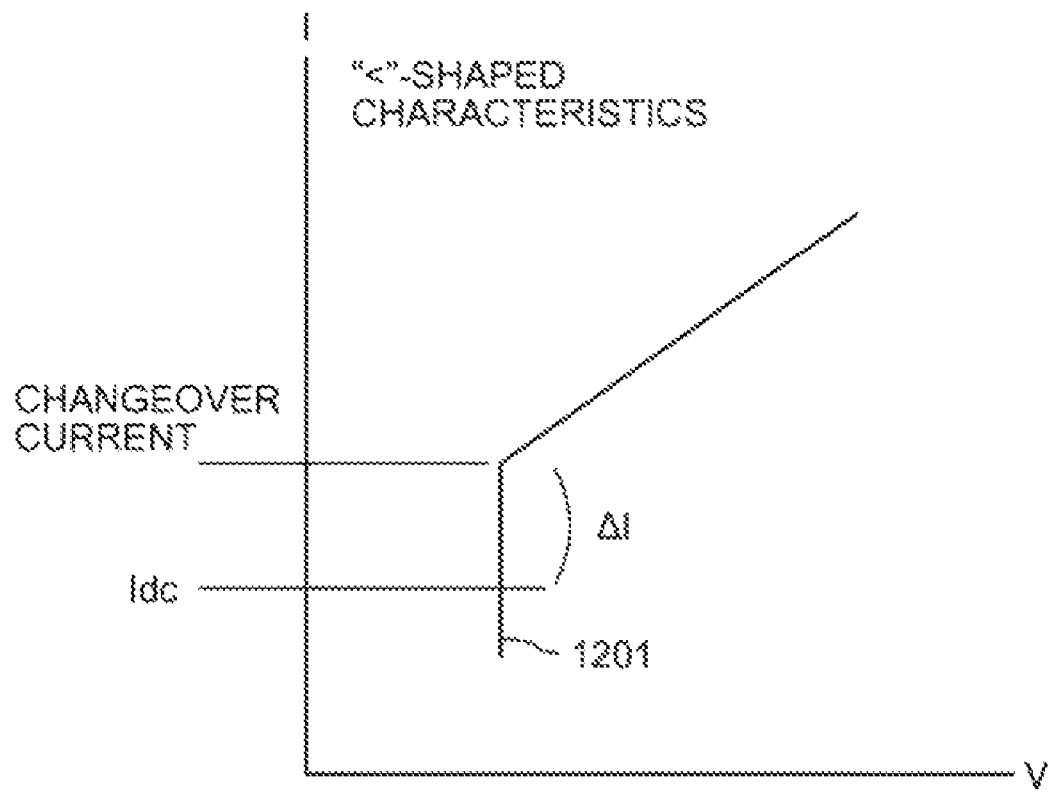
FIG. 12 depicts a graph of load characteristics of an envelope amplifier.

FIG. 12 depicts a graph of load characteristics of an envelope amplifier. In FIG. 12, the horizontal axis represents an output voltage of the envelope amplifier composed of the digital processor 101, the DAC 105, the preamplifier 106, the capacitor 107, the gate bias 108, the bias resistor 109, the first power source 110, the second power source 111, the coil 112, and the switch 113. The vertical axis represents an output current of the envelope amplifier (Idc being current zero point).

Therefore, the slope of characterization curve 1201 indicates the load impedance of the envelope amplifier. During the period in which the low voltage is supplied to the HPA 104, it is preferable that, even if the output current of the envelope amplifier changes, the output voltage is maintained. As depicted, for example, by the characterization curve 1201, it is preferable that the output voltage is kept constant in a AI section of the output current.

That is to say, since the HPA 104 is of low impedance as the load to be driven by the envelope amplifier, it is preferable that the output impedance of the envelope amplifier is kept low as well. In this respect, in the amplifying apparatus 100 according to the second embodiment, the output impedance of the envelope amplifier is kept low by the bypass capacitor 1001 so that the output current from the envelope amplifier to the HPA 104 can be stabilized.

Figure 13:
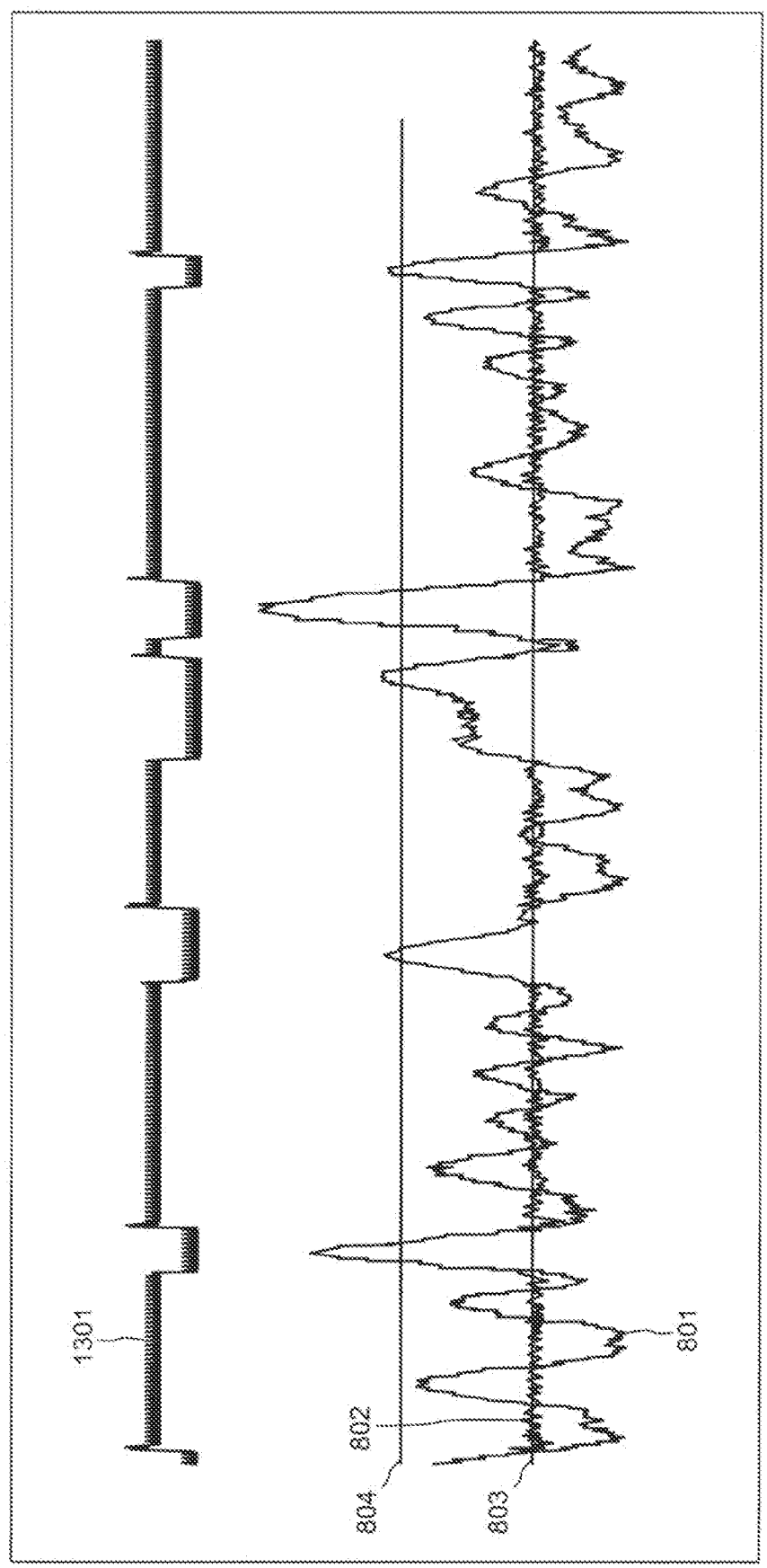
FIG. 13 depicts one example of an active short control signal.

FIG. 13 depicts one example of the active short control signal. In FIG. 13, components identical to those depicted in FIG. 8 are given the same reference numerals used in FIG. 8 and description thereof is omitted hereinafter. An active short control signal 1301 of FIG. 13 is the active short control signal that is generated by the digital processor 101 and to be applied to the gate of the FET 1003.

As depicted in FIG. 13, the active short control signal 1301 is on during the period in which the low voltage is supplied to the HPA 104. The active short control signal 1301 is off during the period in which the high voltage is supplied to the HPA 104. This enables the bypass capacitor 1001 to be validated in the case of supply of the low voltage to the HPA 104 and enables the bypass capacitor 1001 to be invalidated in the case of supply of the high voltage to the HPA 104.

Figure 14:
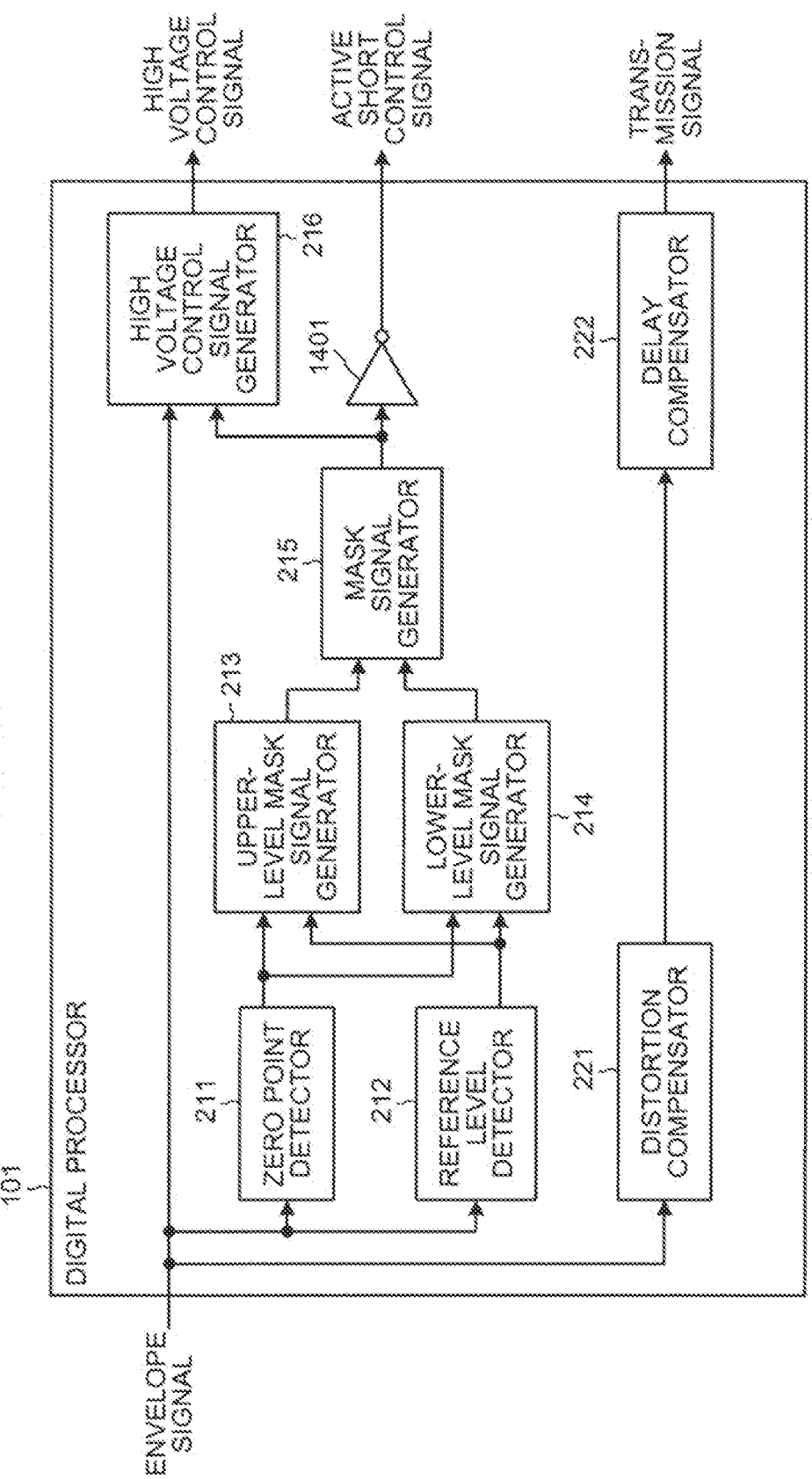
FIG. 14 is a block diagram of a configuration example of the digital processor depicted in FIG. 10.

FIG. 14 is a block diagram of a configuration example of the digital processor depicted in FIG. 10. In FIG. 14, components identical to those depicted in FIG. 2 are given the same reference numerals used in FIG. 2 and description thereof is omitted hereinafter. As depicted in FIG. 14, the digital processor 101 includes an inverting circuit 1401 in addition to the configuration depicted in FIG. 2. The mask signal generator 215 outputs the generated mask signal to the high voltage control signal generator 216 and the inverting circuit 1401.

The inverting circuit 1401 inverts the mask signal output from the mask signal generator 215. Since the mask signal also serves as a signal to determine whether the voltage to be supplied to the HPA 104 is the low voltage or the high voltage, inversion of the mask signal enables the active short control signal to be generated easily. The inverting circuit 1401 outputs the inverted mask signal to the FET 1003 as the active short control signal.

FIGS. 15A and 15B depict reduction of the distortion in the high voltage control signal. In FIGS. 15A and 15B, a transmission signal 1501 is the transmission signal 11. An envelope signal 1502 is the envelope signal of the transmission signal 1501. A high voltage control signal 1503 is the high voltage control signal generated by the digital processor 101.

FIG. 15A indicates, for reference, the high voltage control signal 1503, based on the assumption that the active short circuit including the bypass capacitor 1001, the bias resistor 1002, and the FET 1003 is not disposed in the amplifying apparatus 100. In this case, as depicted in FIG. 15A, the high voltage control signal 1503 is distorted due to the level of input from the multiplier 103 to the HPA 104 during periods T1 and T2 in which the low voltage is supplied to the HPA 104.

FIG. 15B indicates the high voltage control signal 1503 in the case of disposing the active short circuit including the bypass capacitor 1001, the bias resistor 1002, and the FET 1003 in the amplifying apparatus 100. In this case, as depicted in FIG. 15B, the distortion of the high voltage control signal 1503 is suppressed during periods T1 and T2 in which the low voltage is supplied to the HPA 104. Thus, the disposal of the bypass capacitor 1001 makes it possible to suppress the distortion of the high voltage control signal 1503 attributable to the level of input from the multiplier 103 to the HPA 104.

Figure 16A:
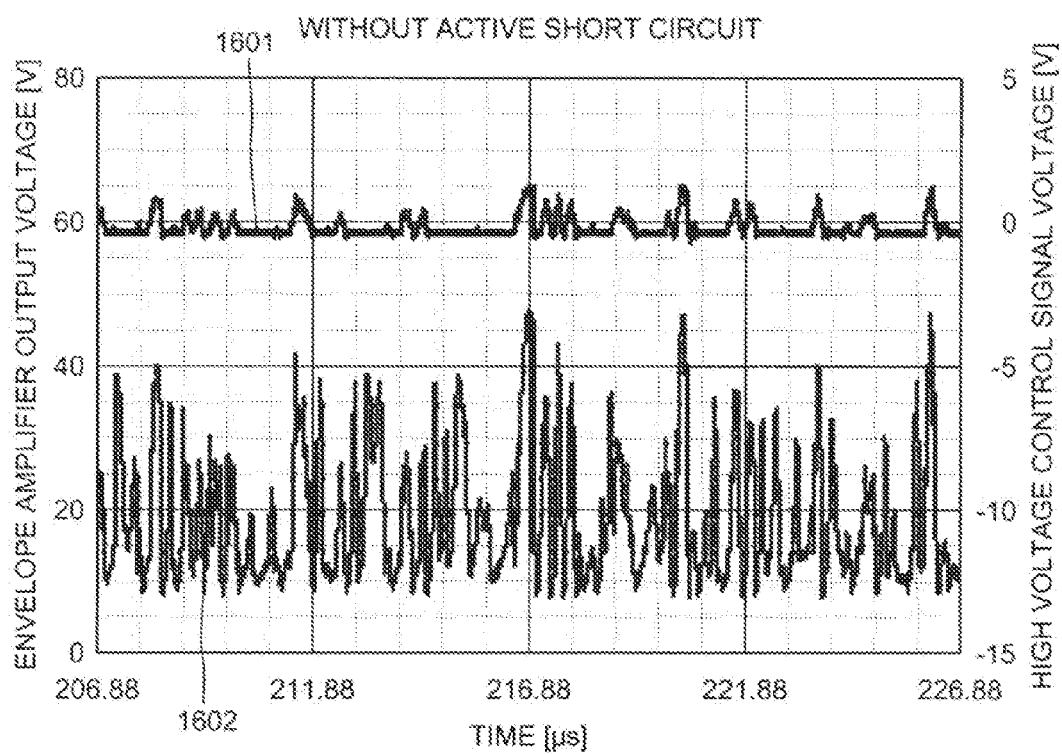
FIG. 16A depicts a first example of measurement of the distortion in the high voltage control signal.

FIG. 16A depicts a first example of measurement of the distortion in the high voltage control signal. FIG. 16B depicts a second example of measurement of the distortion in the high voltage control signal. In FIGS. 16A and 16B, the horizontal axis represents time [μs]. The vertical axis on the right-hand side represents the voltage of the high voltage control signal. A voltage waveform 1601 indicates the voltage waveform of the high voltage control signal. The vertical axis on the left-hand side represents the output voltage from the envelope amplifier to the HPA 104. A voltage waveform 1602 indicates the waveform of the output voltage from the envelope amplifier to the HPA 104.

The voltage waveform 1602 of FIG. 16A indicates, for reference, a measurement example of the output voltage from the envelope amplifier to the HPA 104, based on the assumption that the active short circuit is not disposed in the amplifying apparatus 100. In this case, as depicted in FIG. 16A, the voltage waveform 1602 is not constant and is unstable during the period in which the low voltage is supplied to the HPA 104.

The voltage waveform 1602 of FIG. 16B indicates the measurement example of the output voltage from the envelope amplifier to the HPA 104 in the case of disposing the active short circuit in the amplifying apparatus 100. An active short control signal 1603 of FIG. 16B is the active short control signal output by the digital processor 101.

As depicted in FIG. 16B, when the active short circuit is disposed in the amplifying apparatus 100, the current output from the envelope amplifier to the HPA 104 is prevented from fluctuating during the period in which the active short control signal 1603 is on. This enables the voltage waveform 1602 to be stabilized during the period in which the low voltage is supplied to the HPA 104.

Thus, in the amplifying apparatus 100 according to the second embodiment, the bypass capacitor 1001 is disposed that prevents the current fluctuation of the voltage to be supplied to the HPA 104. This makes it possible to stabilize the voltage to be supplied from the envelope amplifier to the HPA 104 even if the level of the RF signal output from the multiplier 103 to the HPA 104 fluctuates, thereby enabling the RF signal to be amplified with accuracy in the HPA 104.

In the amplifying apparatus 100, the FET 1003 (switching circuit) is disposed that validates the bypass capacitor 1001 during the period in which the low voltage is supplied to the HPA 104 and invalidates the bypass capacitor 1001 during the period in which the high voltage is supplied to the HPA 104. This makes it possible to stabilize the low voltage to be supplied from the envelope amplifier to the HPA 104 while preventing the bypass capacitor 1001 from becoming a load during the period in which the high voltage is supplied to the HPA 104. This enables envelope tracking to be performed stably during the period in which the high voltage is supplied to the HPA 104.

The inversion of the mask signal generated by the mask signal generator 215 enables the active short control signal to be easily generated, which switches the validity/invalidity of the bypass capacitor 1001. This makes it possible to switch the validity/invalidity of the bypass capacitor 1001 accurately and stably.

Figure 17:
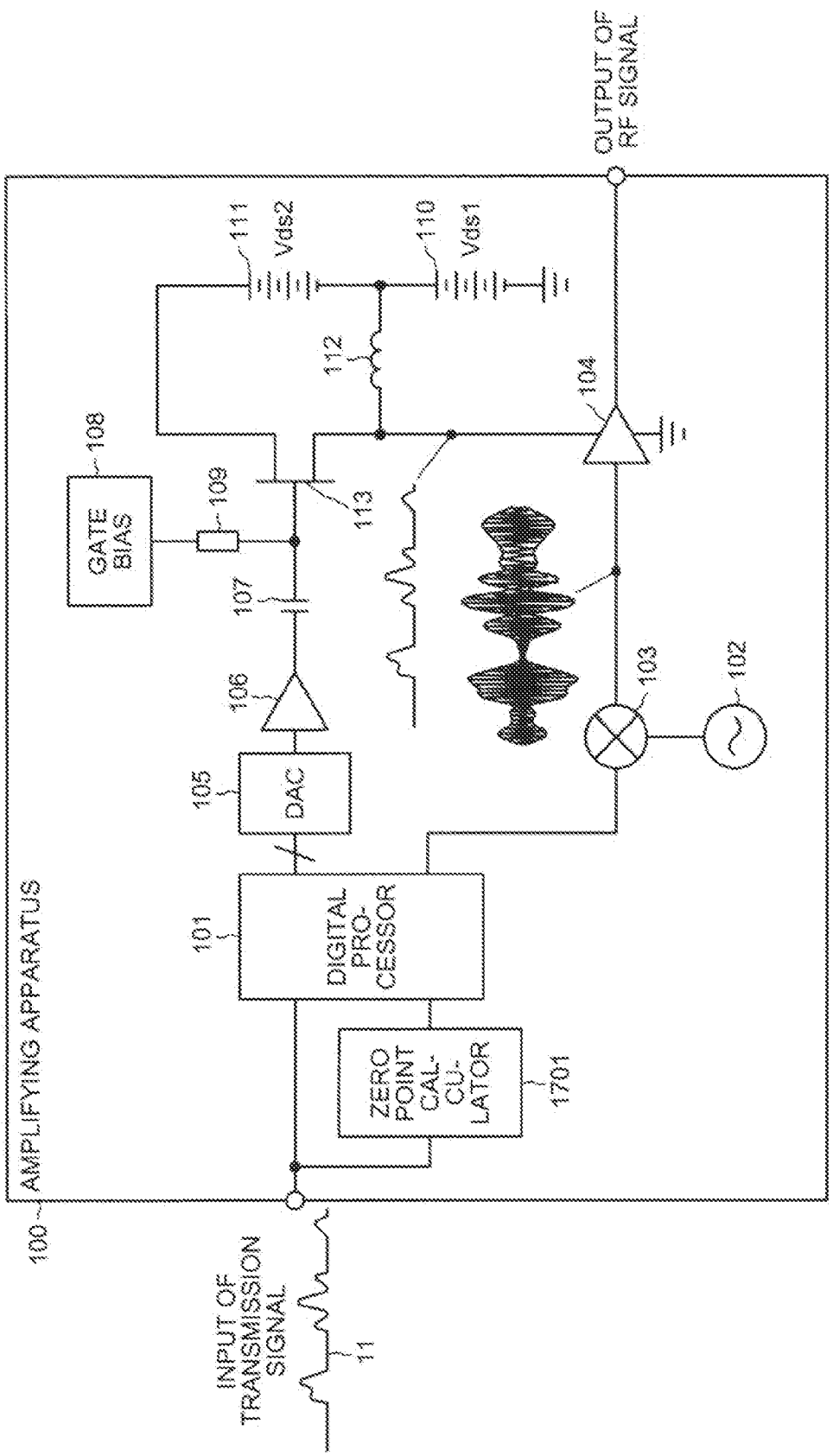
FIG. 17 depicts a configuration of the amplifying apparatus according to a third embodiment.

FIG. 17 depicts a configuration of the amplifying apparatus according to a third embodiment. In FIG. 17, components identical to those depicted in FIG. 1 are given the same reference numerals used in FIG. 1 and description thereof is omitted hereinafter. As depicted in FIG. 17, the amplifying apparatus 100 according to the third embodiment includes a zero point calculator 1701 in addition to the configuration depicted in FIG. 1. The transmission signal is input to the digital processor 101 and the zero point calculator 1701. The zero point calculator 1701 calculates the current zero point of the input transmission signal and outputs to the digital processor 101, a current zero point setting signal indicative of the calculated current zero point.

Figure 18:
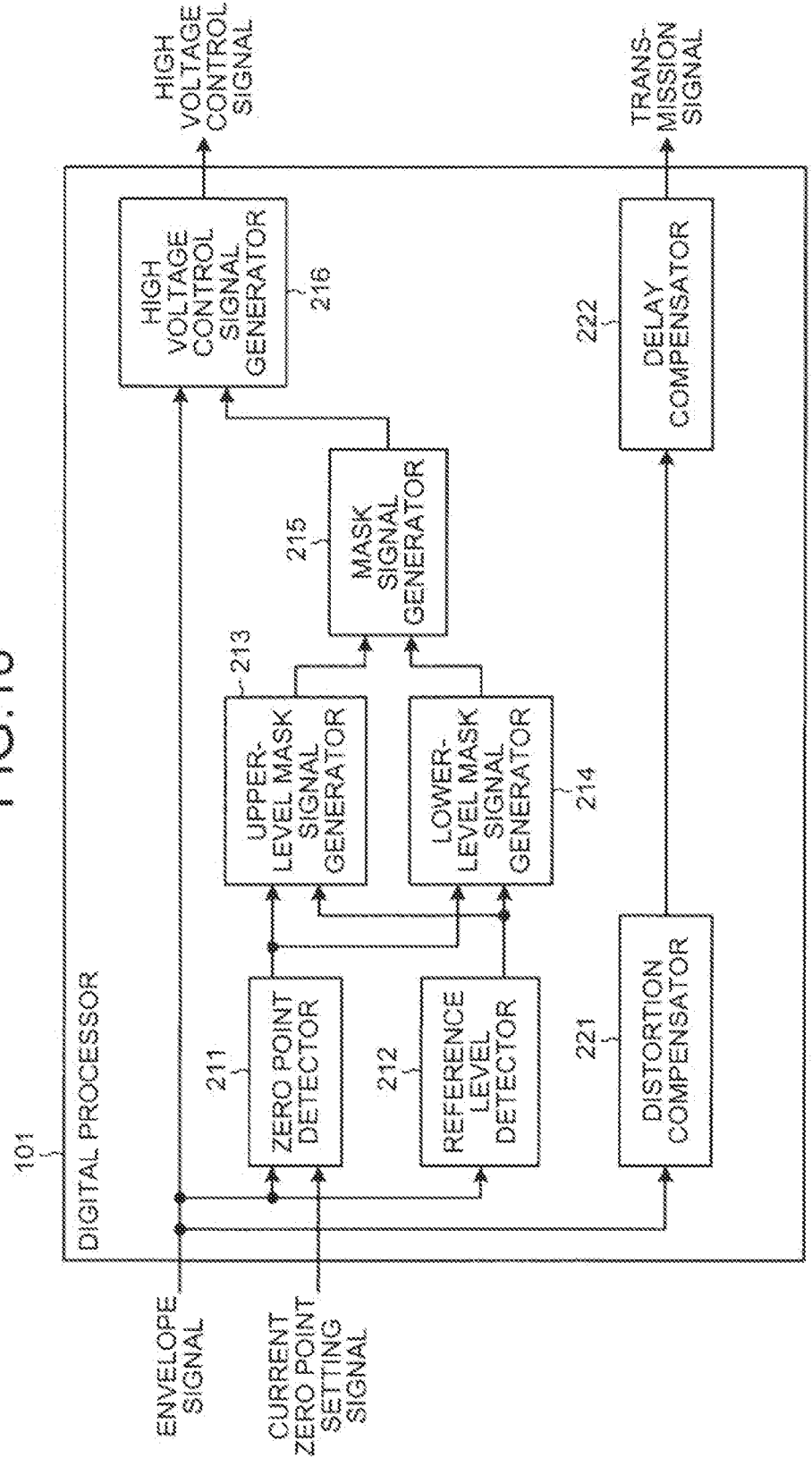
FIG. 18 is a block diagram of a configuration example of the digital processor depicted in FIG. 17.

FIG. 18 is a block diagram of a configuration example of the digital processor depicted in FIG. 17. In FIG. 18, components identical to those depicted in FIG. 2 are given the same reference numerals used in FIG. 2 and description thereof is omitted hereinafter. As depicted in FIG. 18, the zero point detector 211 acquires the current zero point setting signal output from the zero point calculator 1701. The zero point detector 211 detects, in the envelope signal of the input transmission signal 11, the current zero point indicated by the acquired current zero point setting signal.

Figure 19:
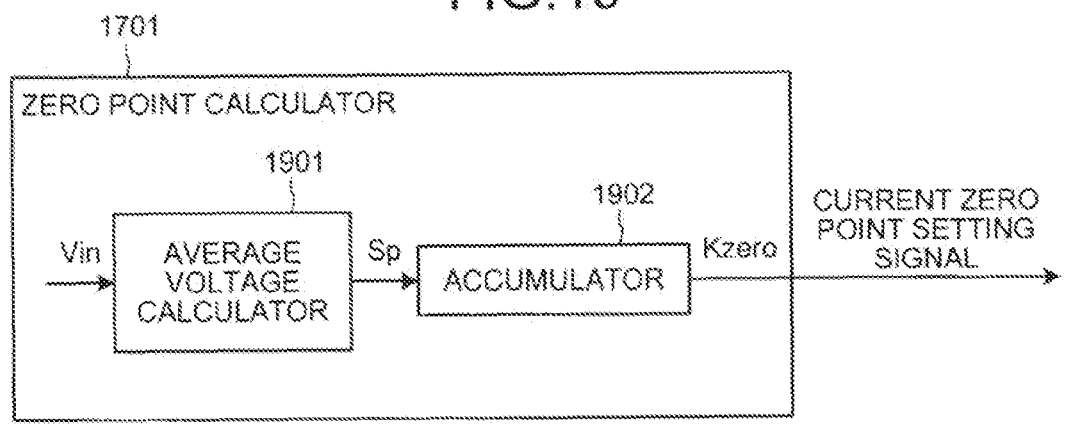
FIG. 19 is a block diagram of a configuration example of the zero point calculator.

FIG. 19 is a block diagram of a configuration example of the zero point calculator. As depicted in FIG. 19, the zero point calculator 1701 includes an average voltage calculator 1901 and an accumulator 1902. The average voltage calculator 1901 calculates an average voltage of the transmission signal 11 (Vin) input to the zero point calculator 1701. Specifically, the average voltage calculator 1901 integrates the transmission signal 11 with respect to the sampling time for the integral interval. The average voltage calculator 1901 outputs the calculated average voltage to the accumulator 1902 (Sp).

The accumulator 1902 operates as a low pass filter (LPF) that removes a high frequency component of the average voltage output from the average voltage calculator 1901. The accumulator 1902 calculates the signal with its high frequency component removed as the current zero point of the transmission signal 11. The signal calculated by the accumulator 1902 is output to the digital processor 101 as the current zero point setting signal (Kzero).

Figure 20A:
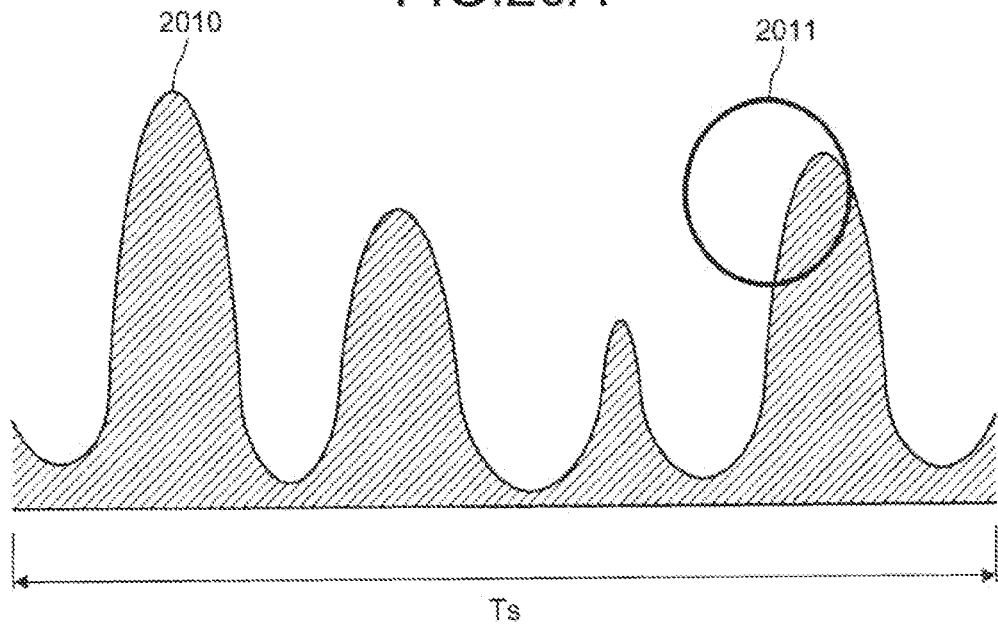
FIGS. 20A and 20B depict a calculation of the average voltage by the average voltage calculator.
Figure 20B:
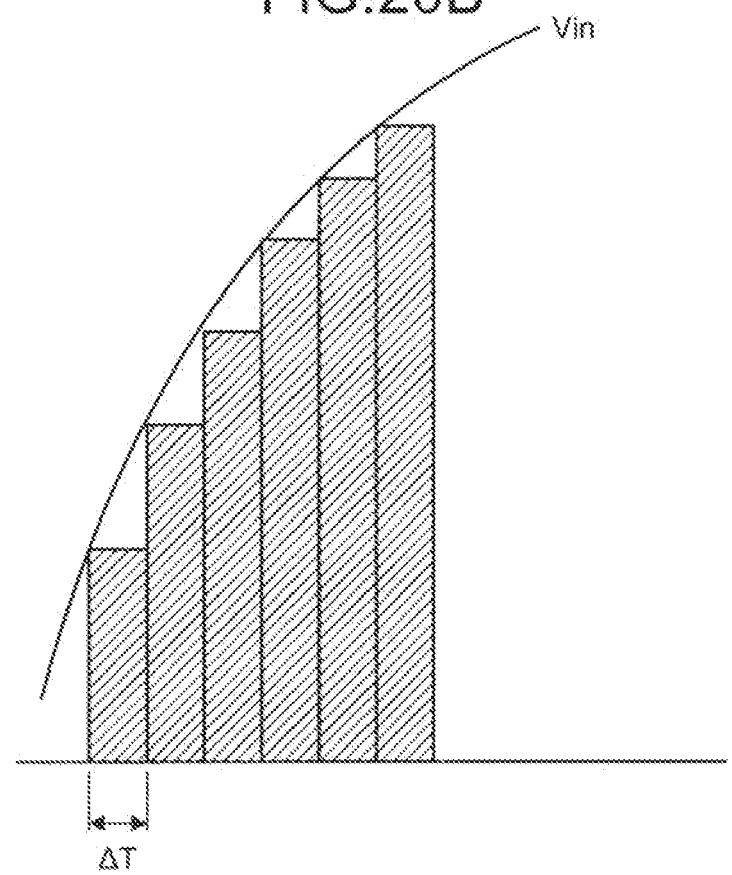

FIGS. 20A and 20B depict a calculation of the average voltage by the average voltage calculator. A voltage waveform 2010 of FIG. 20A indicates the voltage waveform of the transmission signal 11. Interval Ts indicates the integral interval. FIG. 20B indicates an enlargement of a part 2011 of the voltage waveform 2010 of FIG. 20A. Time $\Delta T$ in FIG. 20B indicates the sampling time.

The calculation of the average voltage by the average voltage calculator 1901 corresponds to the calculation of the area of the voltage waveform 2010. Specifically, the average voltage calculator 1901 calculates $Sp=\Sigma Vin \times \Delta T$ for the integral interval Ts and outputs the calculated Sp to the accumulator 1902.

Figure 21:
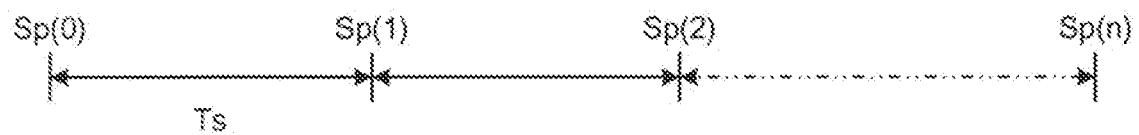
FIG. 21 depicts a calculation of the current zero point by the accumulator.

FIG. 21 depicts a calculation of the current zero point by the accumulator. Sp(0) to Sp(n) of FIG. 21 indicate the average voltage (Sp) to be sequentially output from the average voltage calculator 1901. Interval Ts indicates the integral interval. The accumulator 1902 calculates $\Delta Kzero = \Sigma Sp(n)/n$ for each integral interval Ts and calculates $Kzero = Kzero^{-1} + \Delta Kzero$, based on the calculated $\Delta Kzero$. The accumulator 1902 outputs the calculated Kzero as the current zero point setting signal.

Thus, the amplifying apparatus 100 according to the third embodiment calculates the current zero point of the transmission signal 11 and switches between the low voltage and the high voltage at a timing based on the calculated current zero point. Thus, even if the current zero point changes according to the change of the waveform of the transmission signal 11, the current zero point after the change can automatically be calculated and corrected. Hence, even if the current zero point changes according to the change of the waveform of the transmission signal 11, the distortion of the voltage to be supplied to the HPA 104 can be prevented stably and the RF signal can be amplified with accuracy at the HPA 104.

Figure 22:
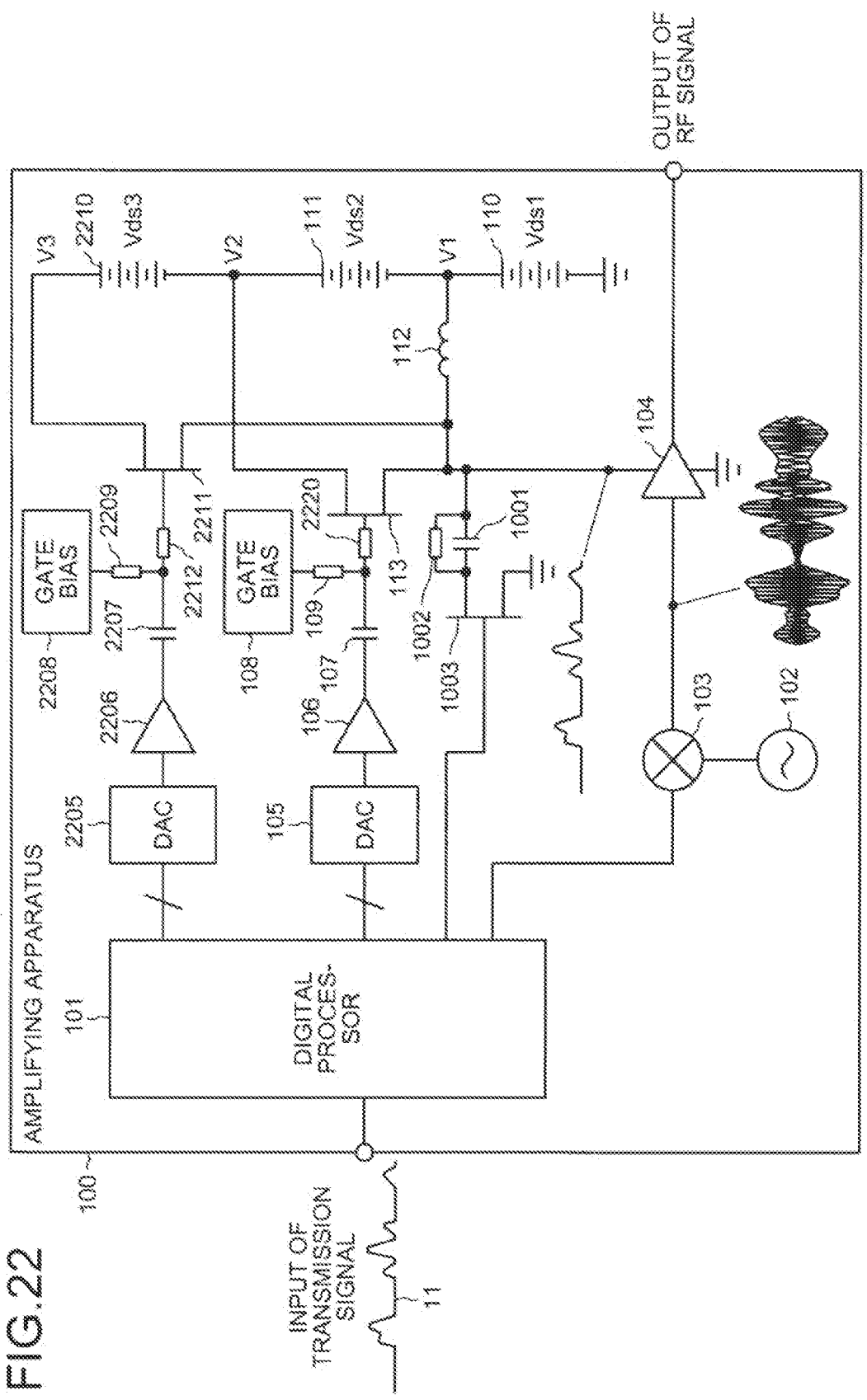
FIG. 22 depicts a configuration of the amplifying apparatus according to a fourth embodiment.

FIG. 22 depicts a configuration of the amplifying apparatus according to a fourth embodiment. In FIG. 22, components identical to those depicted in FIG. 10 are given the same reference numerals used n FIG. 10 and description thereof is omitted hereinafter. As depicted in FIG. 22, the amplifying apparatus 100 according to the fourth embodiment includes a DAC 2205, a preamplifier 2206, a capacitor 2207, a gate bias 2208, a bias resistor 2209, a third power source 2210, and a switch 2211 in addition to the configuration depicted in FIG. 10.

The DAC 2205, the preamplifier 2206, the capacitor 2207, the gate bias 2208, the bias resistor 2209, the third power source 2210, and the switch 2211 are of the same configuration as that of the DAC 105, the preamplifier 106, the capacitor 107, the gate bias 108, the bias resistor 109, the second power source 111, and the switch 113, respectively.

The third power source 2210, however, generates a voltage Vds3. The negative side of the third power source 2210 is connected to the positive side of the second lower source 111 and the positive side of the third power source 2210 is connected to the drain of the switch 2211. The drain of the switch 2211 is connected to the positive side of the third power source 2210. The source of the switch 2211 is connected to the HPA 104. A resistor 2212 is connected at the upstream side of the switch 2211. A resistor 2220 is connected at the downstream side of the switch 113.

Thus, when the digital processor 101 outputs the high voltage control signal to the DAC 2205, the high voltage (Vds1+Vds2+Vds3) is supplied to the HPA 104 during the period in which the high voltage control signal is on. In this case, the low voltage (Vds1) is supplied to the HPA 104 during the period in which the high voltage control signal is off.

When the digital processor 101 outputs the high voltage control signal to the DAC 105, the high voltage (Vds1+Vds2) is supplied to the HPA 104 during the period in which the high voltage control signal is on. In this case, the low voltage (Vds1) is supplied to the HPA 104 during the period in which the high voltage control signal is off.

Thus, depending on to which of the DAC 105 and the DAC 2205 the digital processor 101 outputs the high voltage control signal, the high voltage to be supplied to the HPA 104 can be switched. The digital processor 101 determines the level of the transmission signal 11 and selects the destination to which the high voltage control signal is to be output based on results of the determination. Here, the potential of the positive side of the first power source 110 is given as V1, the potential of the positive side of the second power source 111 given as V2, and the potential of the positive side of the third power source 2210 given as V3 (V1<V2<V3).

Figure 23:
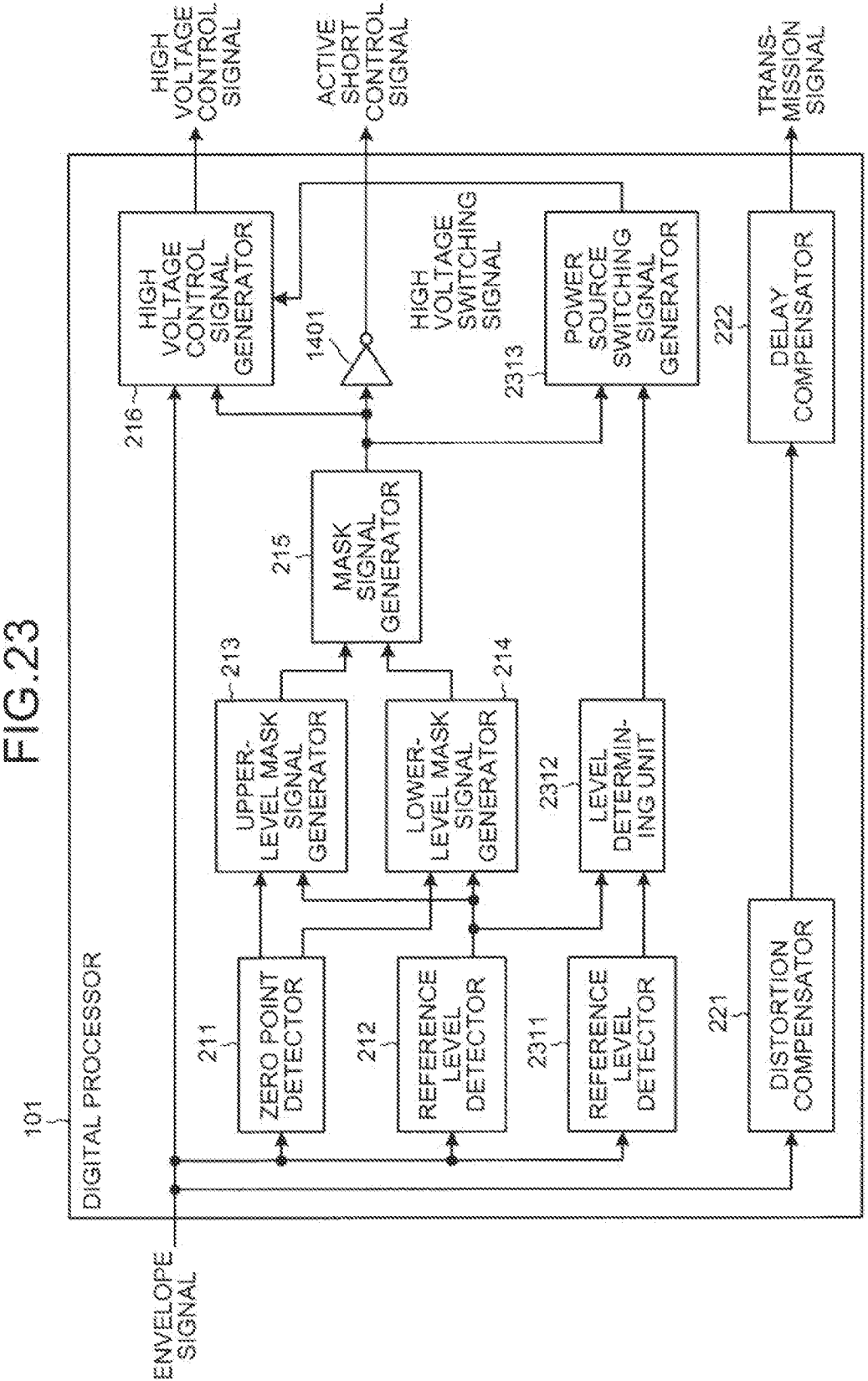
FIG. 23 is a block diagram of a configuration example of the digital processor depicted in FIG. 22.

FIG. 23 is a block diagram of a configuration example of the digital processor depicted in FIG. 22. In FIG. 23, components identical to those depicted FIG. 14 are given the same reference numerals used in FIG. 14 and description thereof is omitted hereinafter. As depicted in FIG. 23, the digital processor 101 according to the fourth embodiment includes a reference level detector 2311, a level determining unit 2312, a power source switching signal generator 2313 in addition to the configuration depicted in FIG. 14.

The transmission signal 11 input to the digital processor 101 is input to the zero point detector 211, the reference level detector 212, the high voltage control signal generator 216, the distortion compensator 221, and the reference level detector 2311. The reference level detector 212 outputs the reference level detection signal indicative of results of detection to the upper-level mask signal generator 213, the lower-level mask signal generator 214, and the level determining unit 2312.

The reference level detector 2311 detects the reference level in the envelope signal of the input transmission signal 11. The reference level detected by the reference level detector 2311 is different from that detected by the reference level detector 212. Here, the reference level detected by the reference level detector 212 is given as V1 and the reference level detected by the reference level detector 2311 is given as V2 (>V1). The reference level detector 2311 outputs the reference level detection signal indicative of the detection results to the level determining unit 2312.

The level determining unit 2312 judges the level of the transmission signal 11 based on the reference level detection signals output from the reference level detector 212 and the reference level detector 2311, and notifies the power source switching signal generator 2313 of results of the judgment. Specifically, when the V1 is detected by the reference level detector 212 and the V2 is not detected by the reference level detector 2311, the level determining unit 2312 reports to the power source switching signal generator 2313, the detection of the V1. When the V2 is detected by the reference level detector 2311, the level determining unit 2312 reports to the power source switching signal generator 2313, the detection of the V2.

The power source switching signal generator 2313 generates a high voltage switching signal, based on the level reported by the level determining unit 2312. For example, when the V1 is reported by the level determining unit 2312, the power source switching signal generator 2313 generates the high voltage switching signal indicative of switching to the V2 high voltage. When the V2 is reported by the level determining unit 2312, the power source switching signal generator 2313 generates the high voltage switching signal indicative of switching to the V3 high voltage. The power source switching signal generator 2313 outputs the generated high voltage switching signal to the high voltage control signal generator 216.

The high voltage control signal generator 216 switches the destination to which the generated high voltage control signal is to be output according to the high voltage switching signal from the power source switching signal generator 2313. Specifically, the high voltage control signal generator 216 outputs the high voltage control signal to the DAC 105 when a high voltage switching signal is output that indicates the switching to the V2 high voltage. The high voltage control signal generator 216 outputs a high voltage control signal to the DAC 2205 when the high voltage switching signal is output that indicates the switching to the V3 high voltage.

When the high voltage control signal is output from the high voltage control signal generator 216 to the DAC 105, the high voltage (Vds1+Vds2) from the first power source 110 and the second power source 111 is supplied to the HPA 104. When the high voltage control signal is output from the high voltage control signal generator 216 to the DAC 2205, the high voltage (Vds1+Vds2+Vds3) from the first power source 110, the second power source 111, and the third power source 2210 is supplied to the HPA 104. This makes it possible to switch the high voltage to be supplied to the HPA 104, based on the level of the transmission signal 11.

Specifically, when it is determined that the level of the transmission signal 11 does not exceed the V2, the high voltage control signal is output to the DAC 105 and the V2 high voltage (Vds1+Vds2) is supplied to the HPA 104. If it is determined that the level of the transmission signal 11 exceeds the V2, the high voltage control signal is output to the DAC 2205 and the V3 high voltage (Vds1+Vds2+Vds3) is supplied to the HPA 104.

FIG. 24 depicts switching of plural high voltages. In FIG. 24, the horizontal axis represents time and the vertical axis represents voltage. An envelope signal 2401 indicates the envelope signal of the transmission signal 11. A generated voltage 2402 indicates the voltage generated by the power source unit including the first power source 110, the second power source 111, and the third power source 2210. A drain voltage 2403 indicates the drain voltage to be supplied the HPA 104.

Since the level of the envelope signal 2401 in period T1 exceeds the V2, the high voltage control signal is output from the digital processor 101 to the DAC 2205. For this reason, the generated voltage 2402 becomes the V3 and the drain voltage 2403 is raised accordingly, enabling the envelope signal 2401 to be amplified with accuracy at the HPA 104.

By contrast, since the level of the envelope signal 2401 in period T2 does not exceed the V2, the high voltage control signal is output from the digital processor 101 to the DAC 105. For this reason, the generated voltage 2402 becomes the V2 and the drain voltage 2403 is lowered accordingly. In this case, since the level of the envelope signal 2401 is low, the envelope signal 2401 can be amplified sufficiently at the HPA 104 even if the drain voltage 2403 is low. This makes it possible to prevent the drain voltage from becoming wastefully high during period T2.

Thus, the amplifying apparatus 100 according to the fourth embodiment generates high voltages of different amplitudes by the first power source 110, the second power source 111, and the third power source 2210. The amplifying apparatus 100 according to the fourth embodiment determines the level of the transmission signal 11, selects from among the high voltages, based on results of the determination, and switches between the selected high voltage and the low voltage to be supplied to the HPA 104. This makes it possible to prevent the drain voltage to be supplied to the HPA 104 from becoming wastefully high at a low level part of the transmission signal 11, thereby lowering power consumption.

As described above, the amplifying apparatus is capable of amplifying the signal with accuracy.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An amplifying apparatus comprising:
an amplifier that amplifies a signal, using a voltage supplied;
a power source unit that generates a first voltage and a second voltage having an amplitude greater than that of the first voltage; and
a switching controller that, when an envelope signal of the signal becomes current zero, switches between and supplies to the amplifier, the first voltage and the second voltage generated by the power source unit,
the switching controller includes:
a zero point detector that detects a rise and a fall from a current zero point, a point at which the envelope signal becomes the current zero, and
a switching unit that supplies the first voltage during a first period from the detection of the fall by the zero point detector until the detection of the rise and supplies the second voltage during a second period from the detection of the rise until the detection of the fall.

2. The amplifying apparatus according to claim 1, wherein the second voltage is of a voltage waveform similar to that of the envelope signal.

3. The amplifying apparatus according to claim 1, wherein the switching controller includes a reference level detector that detects, in the envelope signal, a reference level of a potential higher than that of the current zero, and
the switching unit supplies the second voltage during the second period in which the reference level is detected by the reference level detector and the first voltage during the second period in which the reference level is not detected.

4. The amplifying apparatus according to claim 3, further comprising a delay compensator that compensates for a delay of the first voltage and the second voltage relative to the signal, caused in the detection of the reference level.

5. The amplifying apparatus according to claim 3, wherein the switching controller includes a generator that generates a mask signal indicative of the second period in which the reference level is detected, and
the switching unit supplies the second voltage during the period indicated by the mask signal generated by the generator and supplies the first voltage during a period different from the period indicated by the mask signal.

6. The amplifying apparatus according to claim 5, wherein the generator includes:
a first generator that generates a first mask signal indicative of the period from the detection of the rise until the detection of the reference level and during which the fall is not detected;
a second generator that generates a second mask signal indicative of the period from the detection of the reference level until the detection of the fall; and
a third generator that generates, as the mask signal, a signal indicative of logical OR of the first mask signal and the second mask signal generated by the first generator and the second generator, respectively.

7. The amplifying apparatus according to claim 1, further comprising:
a bypass capacitor connected between the amplifier and the power source unit; and
a switching circuit that validates the bypass capacitor during the period in which the first voltage is supplied to the amplifier and invalidates the bypass capacitor during the period in which the second voltage is supplied to the amplifier.

8. The amplifying apparatus according to claim 5, further comprising:
a bypass capacitor connected between the amplifier and the power source unit;
an inverting circuit that inverts the mask signal generated by the generator; and
a switching circuit that validates the bypass capacitor during the period indicated by the mask signal inverted by the inverting circuit and invalidates the bypass capacitor during a period different from the period indicated by the mask signal.

9. The amplifying apparatus according to claim 1, further comprising:
a calculating unit that calculates a current zero point at which the envelope signal becomes the current zero, wherein
the switching controller switches between the first voltage and the second voltage when the envelope signal of the signal becomes the current zero point calculated by the calculating unit.

10. The amplifying apparatus according to claim 1, further comprising a determining unit that determines the level of the signal, wherein
the power source unit generates a plurality of the second voltages of different amplitudes, and
the switching controller selects from among the second voltages, based on results of the determination by the determining unit and switches between the selected second voltage and the first voltage to be supplied.

11. An amplifying method for an apparatus having an amplifier, comprising:
generating a first voltage and a second voltage having an amplitude greater than that of the first voltage; and
switching between and supplying to the amplifier, the first voltage and the second voltage generated by the power source unit, when an envelope signal of the signal becomes current zero;
amplifying a signal using the voltage supplied,
the switching includes:
detecting a rise and a fall from a current zero point, a point at which the envelope signal becomes the current zero, and
supplying the first voltage during a first period from the detection of the fall until the detection of the rise and supplies the second voltage during a second period from the detection of the rise until the detection of the fall.

* * * * *